(12) United States Patent
Hsiao et al.

(10) Patent No.: US 12,414,347 B2
(45) Date of Patent: Sep. 9, 2025

(54) METHOD OF MANUFACTURING A SEMICONDUCTOR DEVICE AND A SEMICONDUCTOR DEVICE

(71) Applicant: Taiwan Semiconductor Manufacturing Company, Ltd., Hsinchu (TW)

(72) Inventors: Hsu Ming Hsiao, Hsinchu (TW); Shen Wang, Hsinchu (TW); Kung Shu Hsu, Hsinchu (TW); Hong Pin Lin, Hsinchu (TW); Shiang-Bau Wang, Pingzchen (TW); Che-Fu Chen, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/664,595

(22) Filed: May 15, 2024

(65) Prior Publication Data

US 2024/0297225 A1    Sep. 5, 2024

Related U.S. Application Data

(62) Division of application No. 17/460,097, filed on Aug. 27, 2021, now Pat. No. 12,027,594.

(51) Int. Cl.
*H10D 64/01* (2025.01)
*H01L 21/3105* (2006.01)
(Continued)

(52) U.S. Cl.
CPC ....... *H10D 64/01* (2025.01); *H01L 21/31051* (2013.01); *H01L 21/31116* (2013.01); *H01L 22/26* (2013.01); *H10D 64/017* (2025.01)

(58) Field of Classification Search
CPC ............. H01L 29/401; H01L 21/31051; H01L 21/31116; H01L 22/26; H01L 29/66545
See application file for complete search history.

(56) References Cited

U.S. PATENT DOCUMENTS 10,038,080 B1   7/2018   Cheng et al.
11,694,933 B2   7/2023   Chen et al.
(Continued)

OTHER PUBLICATIONS

Notice of Allowance issued in U.S. Appl. No. 17/460,097, dated Feb. 15, 2024.

*Primary Examiner* — Zandra V Smith
*Assistant Examiner* — Andre C Stevenson
(74) *Attorney, Agent, or Firm* — STUDEBAKER BRACKETT PLLC

(57) ABSTRACT

In a method of manufacturing a semiconductor device, a sacrificial gate structure including sacrificial gate electrode is formed over a substrate. A first dielectric layer is formed over the sacrificial gate structure. A second dielectric layer is formed over the first dielectric layer. The second and first dielectric layers are planarized and recessed, and an upper portion of the sacrificial gate structure is exposed. A third dielectric layer is formed over the exposed sacrificial gate structure and over the first dielectric layer. A fourth dielectric layer is formed over the third dielectric layer. The fourth and third dielectric layers are planarized, and the sacrificial gate electrode is exposed and part of the third dielectric layer remains on the recessed first dielectric layer. The recessing the first dielectric layer comprises a first etching operation and a second etching operation using a different etching as from the first etching operation.

20 Claims, 25 Drawing Sheets

(51) Int. Cl.
*H01L 21/311* (2006.01)
*H01L 21/66* (2006.01)

(56) References Cited

U.S. PATENT DOCUMENTS

| | | | |
|---|---|---|---|
| 12,027,594 B2* | 7/2024 | Hsiao | ................ H01L 21/31116 |
| 2021/0375858 A1 | 12/2021 | Chiang et al. | |
| 2022/0246479 A1* | 8/2022 | Huang | .............. H01L 29/41733 |

* cited by examiner

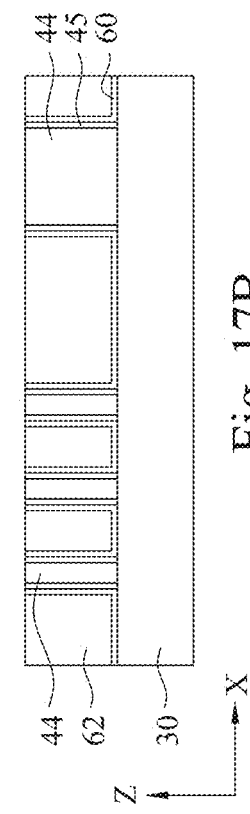
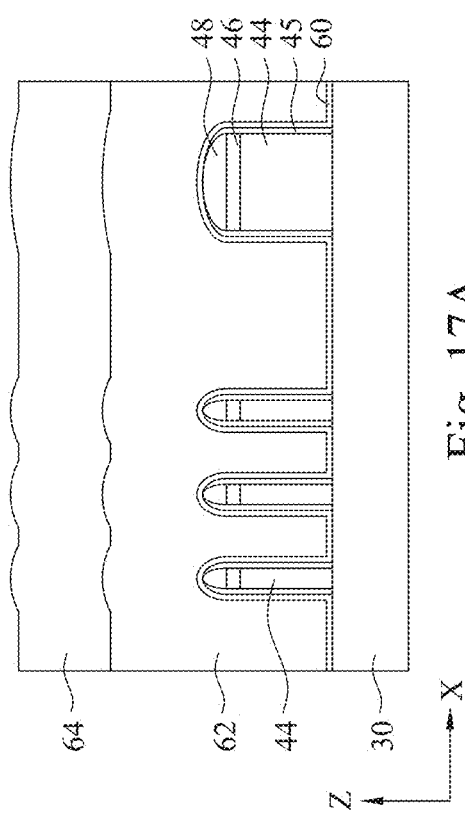
Fig. 17A
Fig. 17B
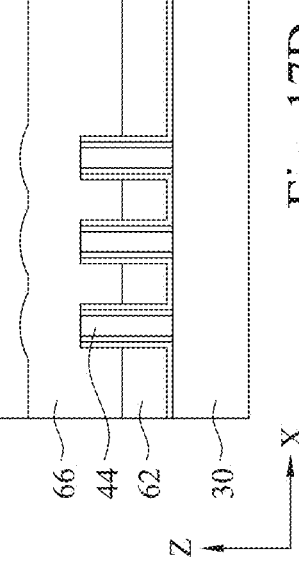
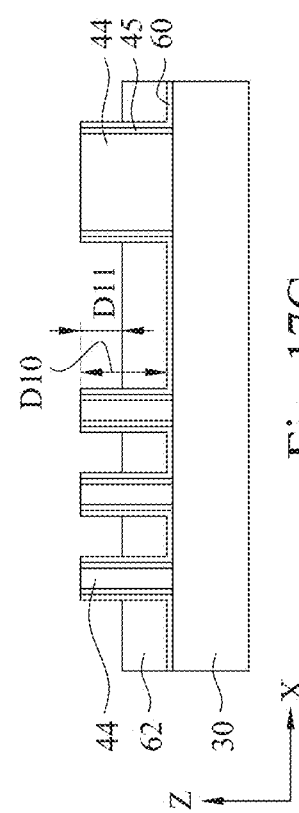
Fig. 17C
Fig. 17D

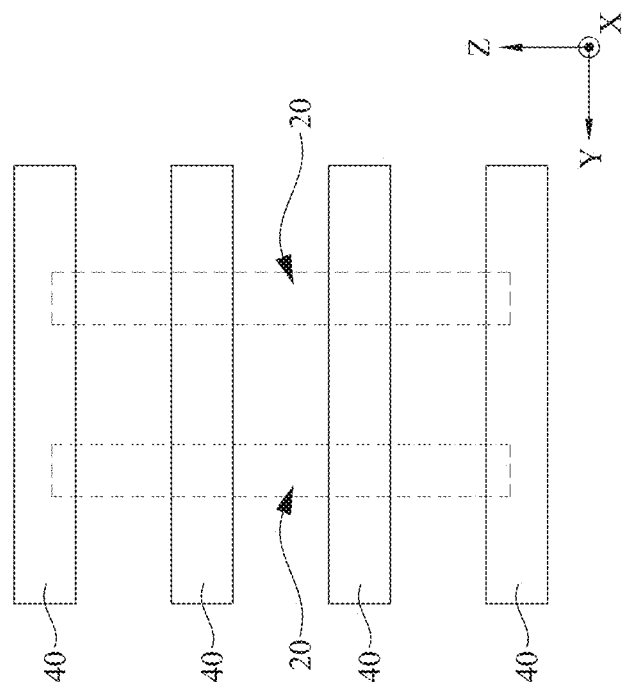
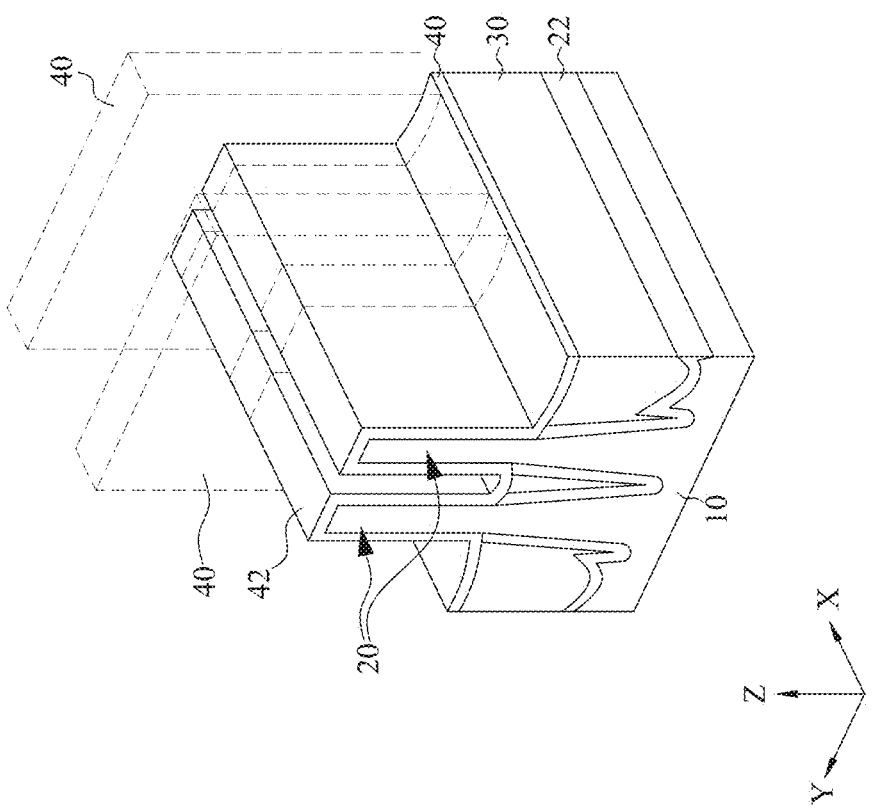
Fig. 19A
Fig. 19B

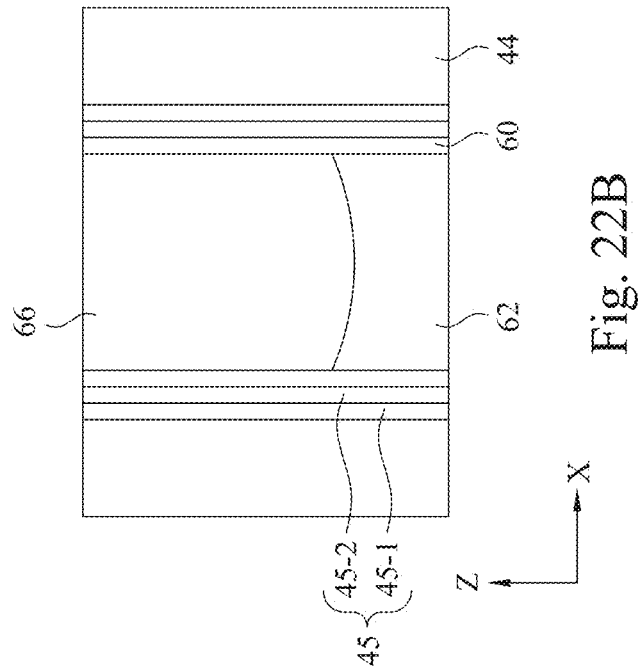
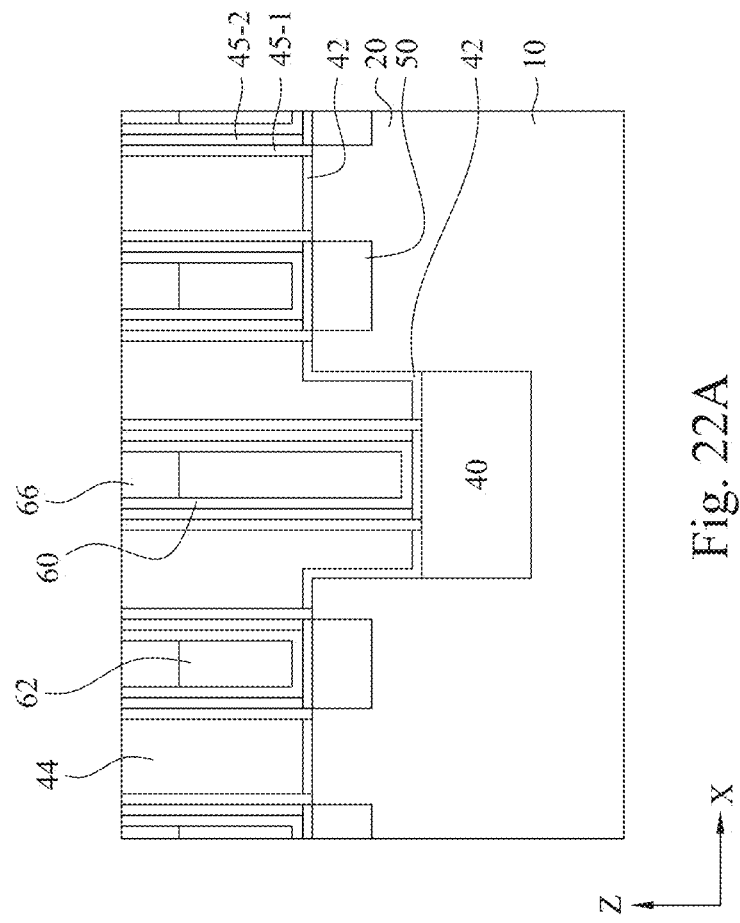
Fig. 22A
Fig. 22B

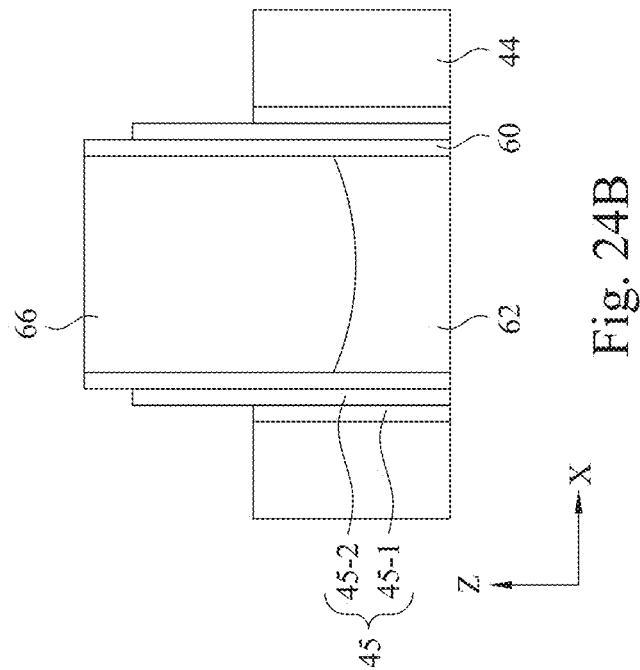
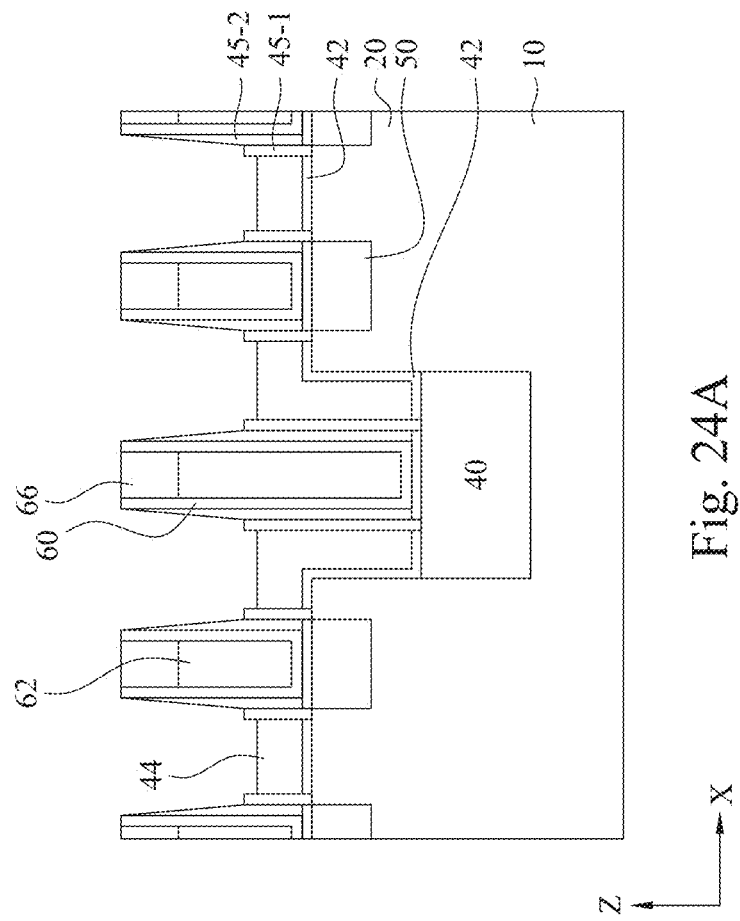
Fig. 24A
Fig. 24B

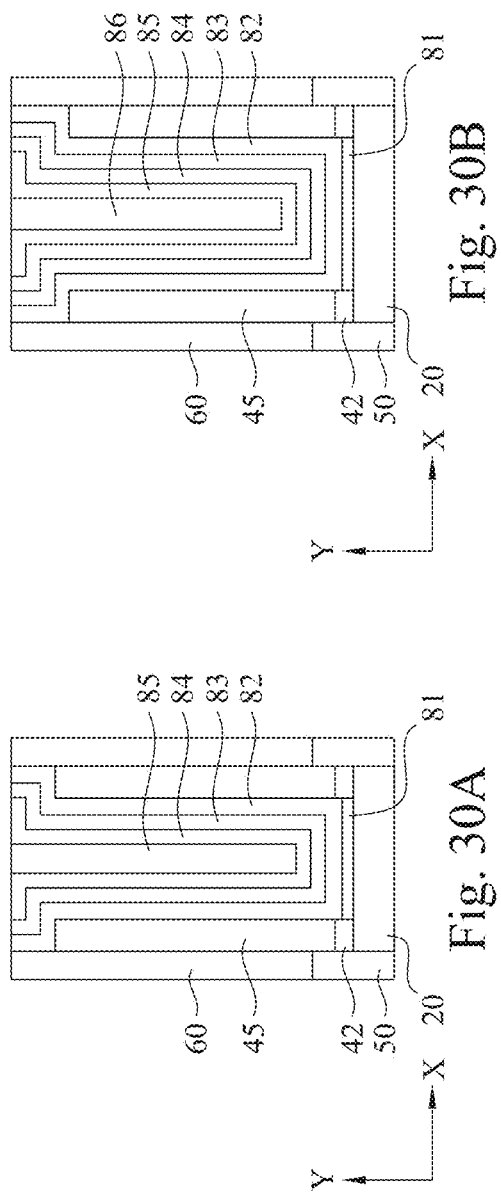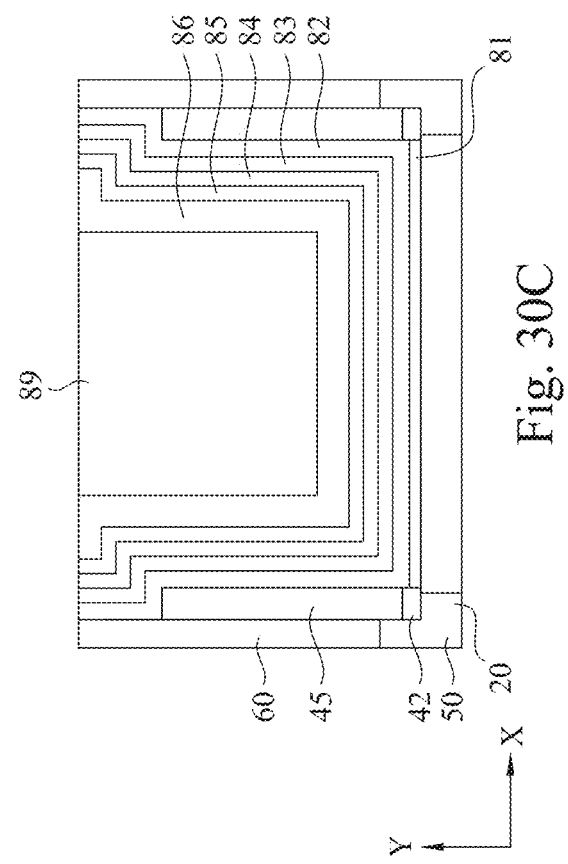

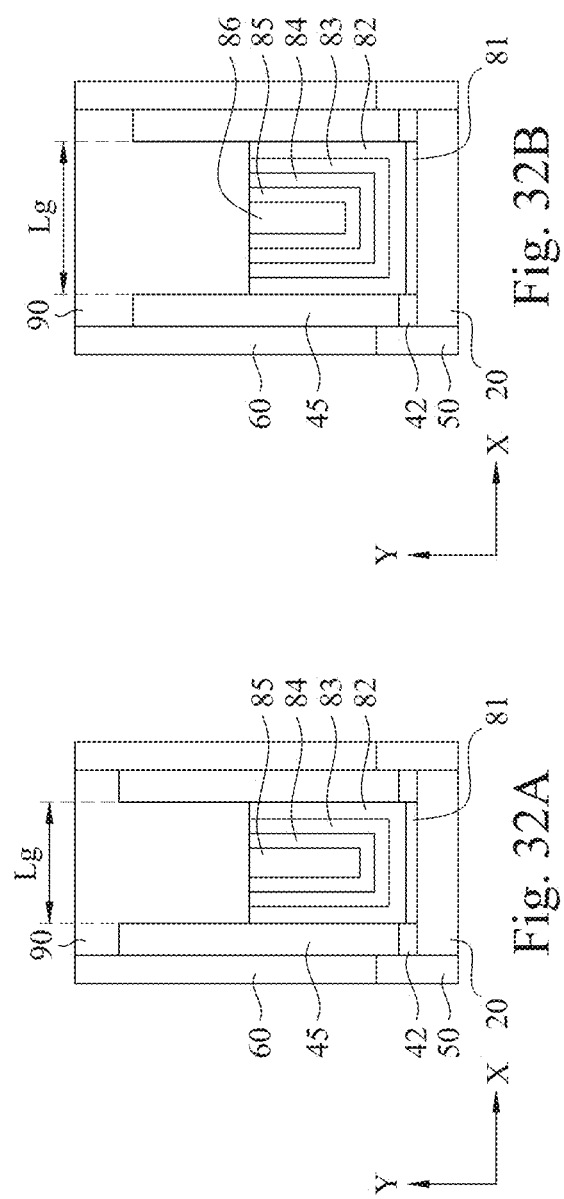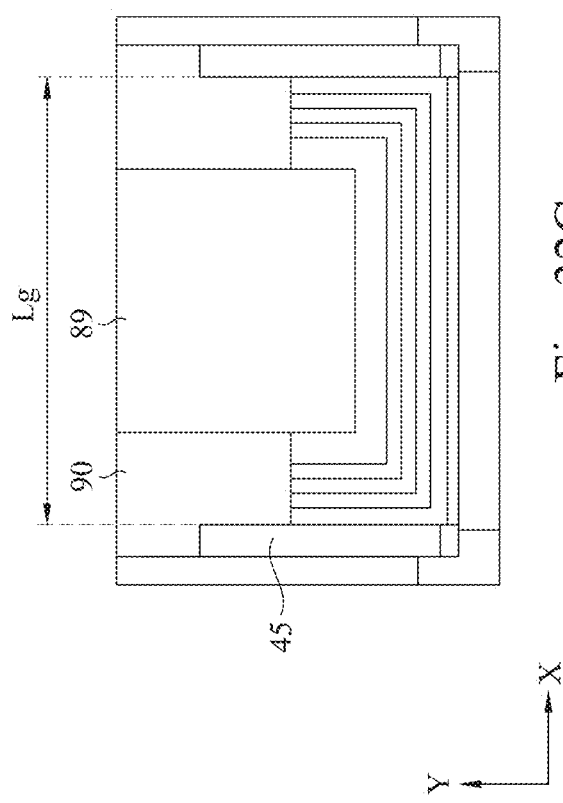

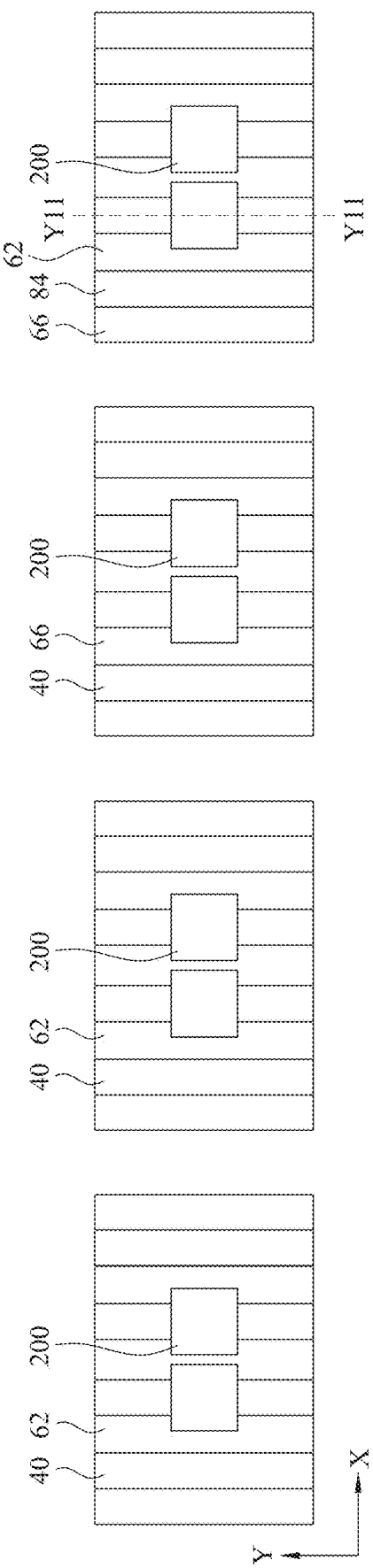
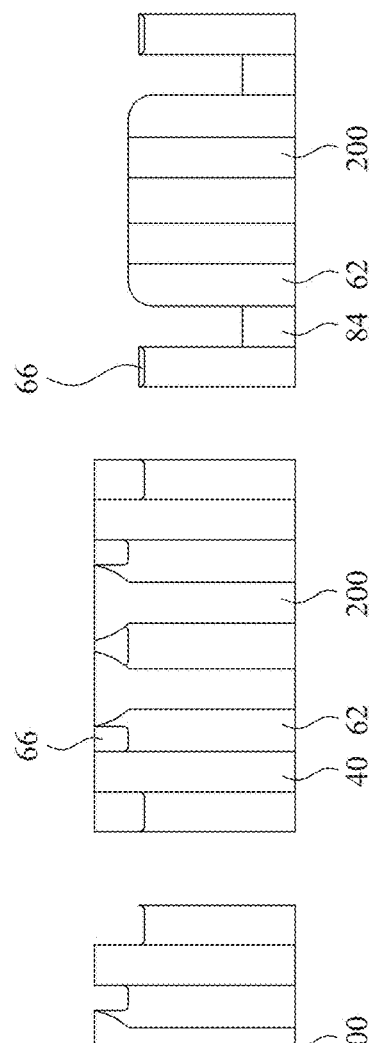
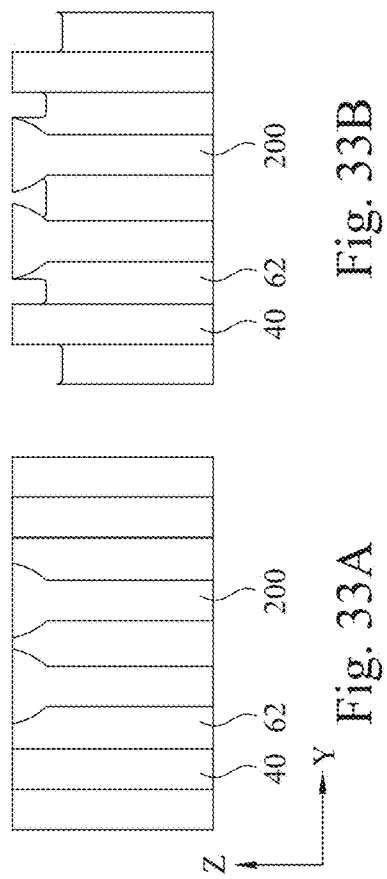
Fig. 33A  Fig. 33B  Fig. 33C  Fig. 33D

METHOD OF MANUFACTURING A SEMICONDUCTOR DEVICE AND A SEMICONDUCTOR DEVICE

RELATED APPLICATION

This application is a divisional application of U.S. application Ser. No. 17/460,097 filed Aug. 27, 2021, the entire disclosure of which is incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a fin FET (FinFET) and a gate-all-around (GAA) FET. In a FinFET, a gate electrode is adjacent to three side surfaces of a channel region with a gate dielectric layer interposed therebetween. A gate electrode of a FinFET includes one or more layers of metallic material formed by a gate replacement technology.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 17A, 17B, 17C and 17D show various stages of a sequential process for manufacturing a semiconductor device according to an embodiment of the present disclosure.

FIGS. 19A and 19B show one of the stages of a sequential process for manufacturing a semiconductor device according to an embodiment of the present disclosure.

FIGS. 22A and 22B show one of the stages of a sequential process for manufacturing a semiconductor device according to an embodiment of the present disclosure.

FIGS. 24A and 24B show one of the stages of a sequential process for manufacturing a semiconductor device according to an embodiment of the present disclosure.

FIGS. 30A, 30B and 30C show one of the various stages of a sequential process for manufacturing a semiconductor device according to an embodiment of the present disclosure.

FIGS. 32A, 32B and 32C show one of the various stages of a sequential process for manufacturing a semiconductor device according to an embodiment of the present disclosure.

FIGS. 33A, 33B, 33C and 33D show the various stages of a sequential process for manufacturing a semiconductor device according to an embodiment of the present disclosure.

DETAILED DESCRIPTION

Figure 2:
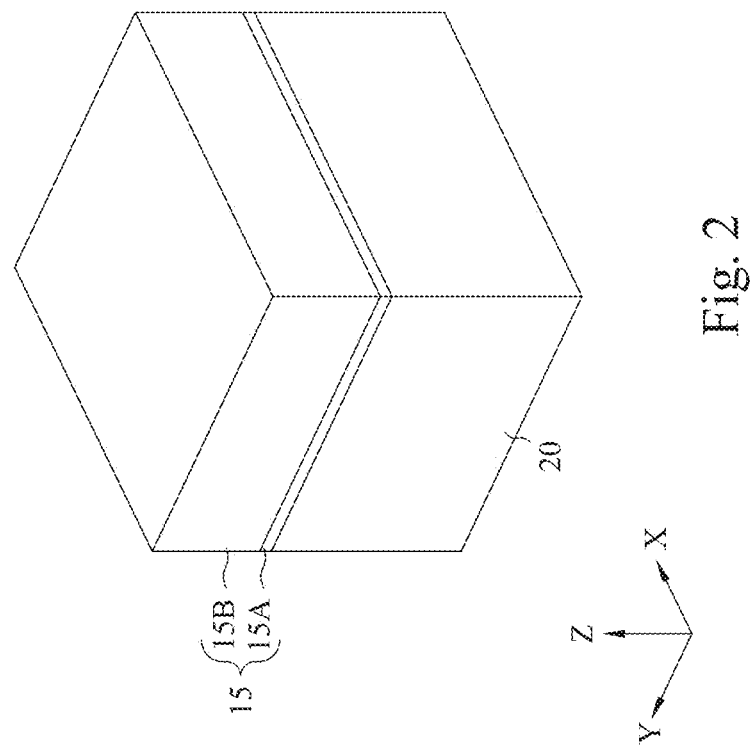
FIG. 2 shows one of the stages of a sequential process for manufacturing a semiconductor device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

In a gate replacement technology, a sacrificial gate structure including a sacrificial gate electrode (made of, for example, polysilicon) is first formed over a channel region and subsequently is replaced with a metal gate structure. In the gate replacement technology, various planarization operations, such as chemical mechanical polishing processes, are employed to planarize a dielectric layer, a polysilicon layer and/or a metallic layer. Further, in some FinFET devices, after the gate replacement process to form a metal gate structure, an upper portion of the metal gate structure is recessed and a cap insulating layer is formed over the recessed gate structure to secure an isolation between the metal gate electrode and adjacent conductive contacts. In the present disclosure, a method of suppressing a dishing problem in a chemical-mechanical polishing (CMP) operation, and to improve isolation property of the cap insulating layer is provided.

FIGS. 1-16 show a sequential process for manufacturing an FET device according to an embodiment of the present disclosure. It is understood that additional operations can be provided before, during, and after processes shown by FIGS. 1-16, and some of the operations described below can be replaced or eliminated, for additional embodiments of the method. The order of the operations/processes may be interchangeable.

Figure 1:
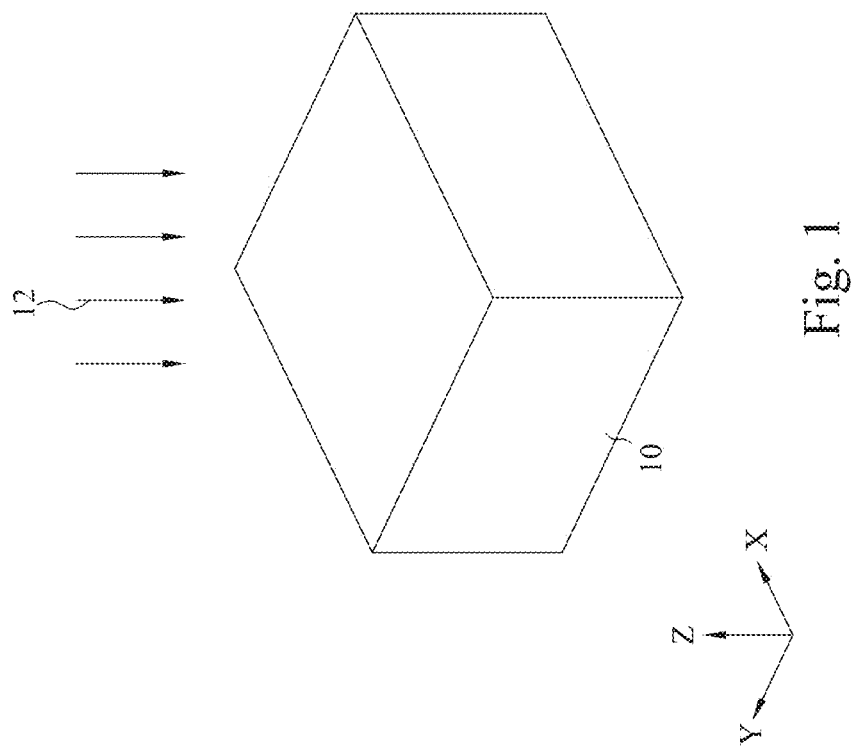
FIG. 1 shows one of the stages of a sequential process for manufacturing a semiconductor device according to an embodiment of the present disclosure.

As shown in FIG. 1, impurity ions (dopants) 12 are implanted into a substrate 10 to form a well region. The ion implantation is performed to prevent a punch-through effect.

In one embodiment, the substrate 10 includes a single crystalline semiconductor layer on at least its surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb and InP. In this embodiment, the substrate 10 is made of Si.

The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on the silicon substrate 10. The germanium concentration of the SiGe buffer layers may increase from 30 atomic % germanium for the bottom-most buffer layer to 70 atomic % germanium for the top-most buffer layer.

The substrate 10 may include various regions that have been suitably doped with impurities (e.g., p-type or n-type conductivity). The dopants 12 are, for example boron ($BF_2$) for an n-type Fin FET and phosphorus for a p-type Fin FET.

In FIG. 2, a mask layer 15 is formed over the substrate 10. In some embodiments, the mask layer 15 includes a first mask layer 15A and a second mask layer 15B. In some embodiments, the first mask layer 15A is made of silicon nitride and the second mask layer 15B is made of a silicon oxide. In other embodiments, the first mask layer 15A is made of silicon oxide and the second mask layer 15B is made of silicon nitride (SiN). The first and second mask layers are formed by chemical vapor deposition (CVD), including low pressure CVD (LPCVD) and plasma enhanced CVD (PECVD), physical vapor deposition (PVD), atomic layer deposition (ALD), or other suitable process. The mask layer 15 is patterned into a mask pattern by using patterning operations including photo lithography and etching.

Figure 3:
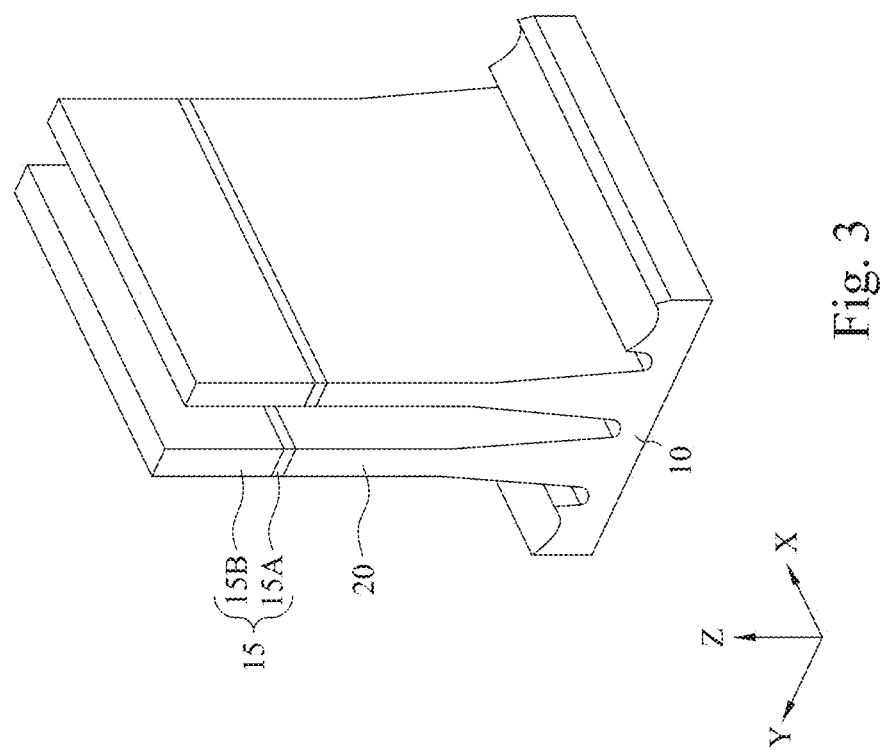
FIG. 3 shows one of the stages of a sequential process for manufacturing a semiconductor device according to an embodiment of the present disclosure.

Next, as shown in FIG. 3, the substrate 10 is patterned by using the patterned mask layer 15 into fin structures 20 extending in the X direction. In FIG. 3, two fin structures 20 are arranged in the Y direction. However, the number of the fin structures is not limited to two, and may be as small as one and three or more. In some embodiments, one or more dummy fin structures are formed on both sides of the fin structures 20 to improve pattern fidelity in the patterning operations.

The fin structures 20 may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and is patterned using a photolithography process. Spacers are formed alongside the patterned sacrificial layer using a self-aligned process. The sacrificial layer is then removed, and the remaining spacers may then be used to pattern the fin structures.

After the fin structures are formed, an insulating material layer including one or more layers of insulating material is formed over the substrate so that the fin structures are fully embedded in the insulating layer. The insulating material for the insulating layer may include silicon oxide, silicon nitride, silicon oxynitride (SiON), SiOCN, SiCN, fluorine-doped silicate glass (FSG), or a low-k dielectric material, formed by LPCVD (low pressure chemical vapor deposition), plasma-CVD or flowable CVD. An anneal operation may be performed after the formation of the insulating layer. Then, a planarization operation, such as a chemical mechanical polishing (CMP) method and/or an etch-back method, is performed such that the upper surfaces of the fin structures 20 are exposed from the insulating material layer 30 as shown in FIG. 4.

Figure 4:
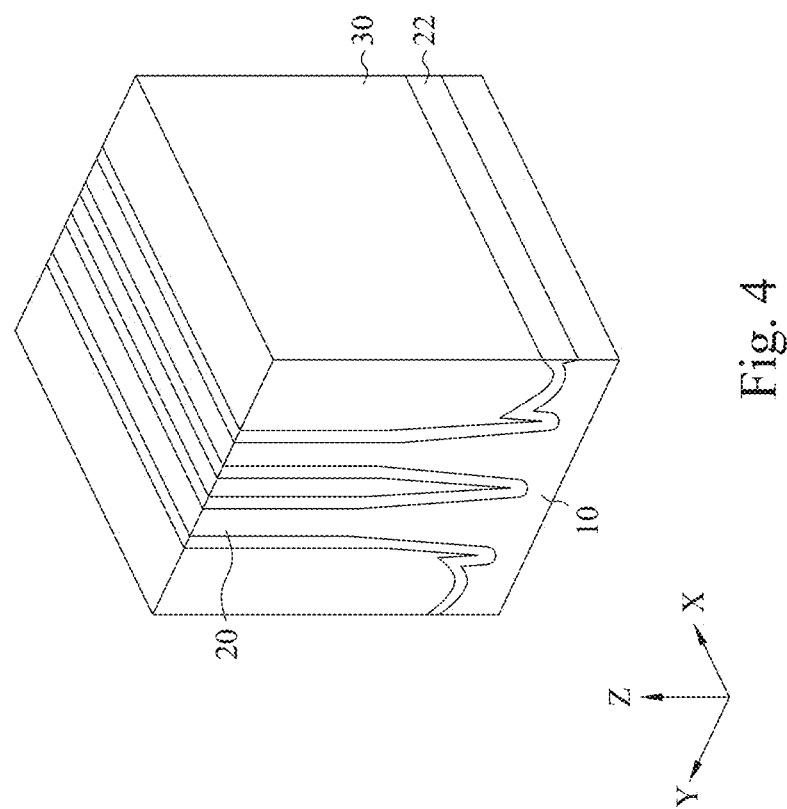
FIG. 4 shows one of the stages of a sequential process for manufacturing a semiconductor device according to an embodiment of the present disclosure.

In some embodiments, one or more liner layers 22 are formed over the structure of FIG. 3 before forming the insulating material layer 30, as shown FIG. 4. The liner layer 22 includes one or more of silicon nitride, SiON, SiCN, SiOCN, and silicon oxide.

Figure 5:
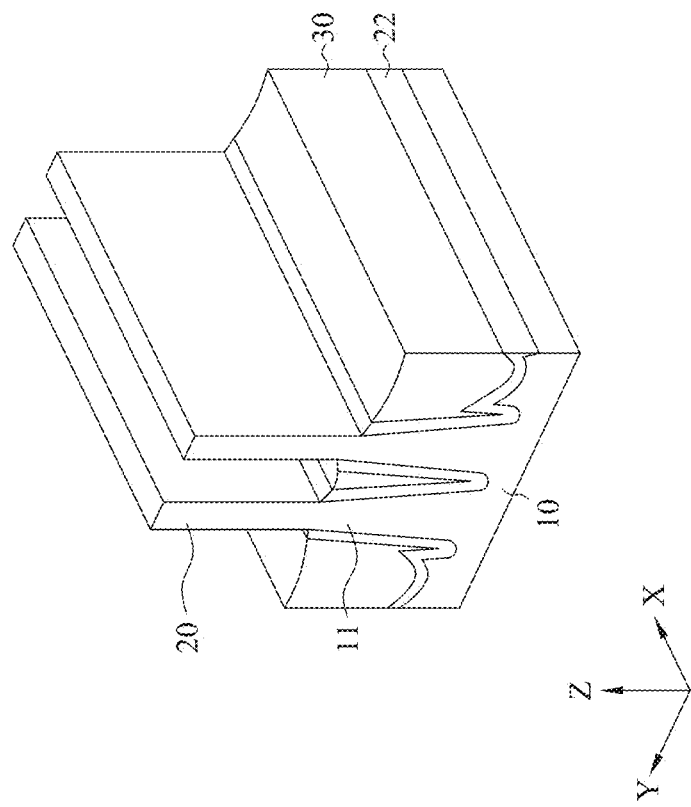
FIG. 5 shows one of the stages of a sequential process for manufacturing a semiconductor device according to an embodiment of the present disclosure.

Then, as shown in FIG. 5, the insulating material layer 30 is recessed to form an isolation insulating layer 30 so that the upper portions of the fin structures 20 are exposed. With this operation, the fin structures 20 are electrically separated from each other by the isolation insulating layer 30, which is also called a shallow trench isolation (STI). The lower portion 11 of the fin structures are embedded in the isolation insulating layer 30.

Figure 6:
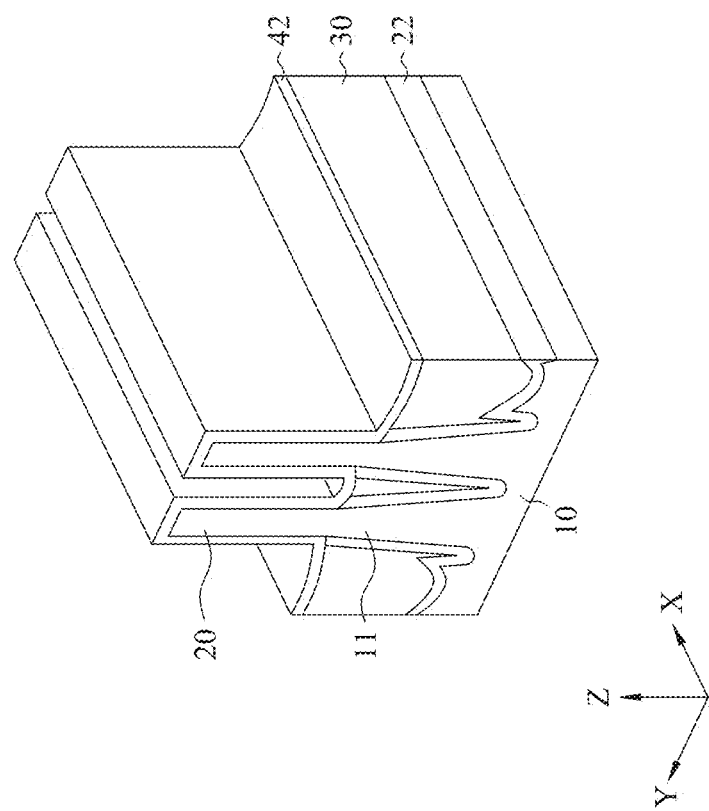
FIG. 6 shows one of the stages of a sequential process for manufacturing a semiconductor device according to an embodiment of the present disclosure.

After the isolation insulating layer 30 is formed, a sacrificial gate dielectric layer 42 is formed, as shown in FIG. 6. The sacrificial gate dielectric layer 42 includes one or more layers of insulating material, such as a silicon oxide-based material. In one embodiment, silicon oxide formed by CVD is used. The thickness of the sacrificial gate dielectric layer 42 is in a range from about 1 nm to about 5 nm in some embodiments.

Figures 7, 8:
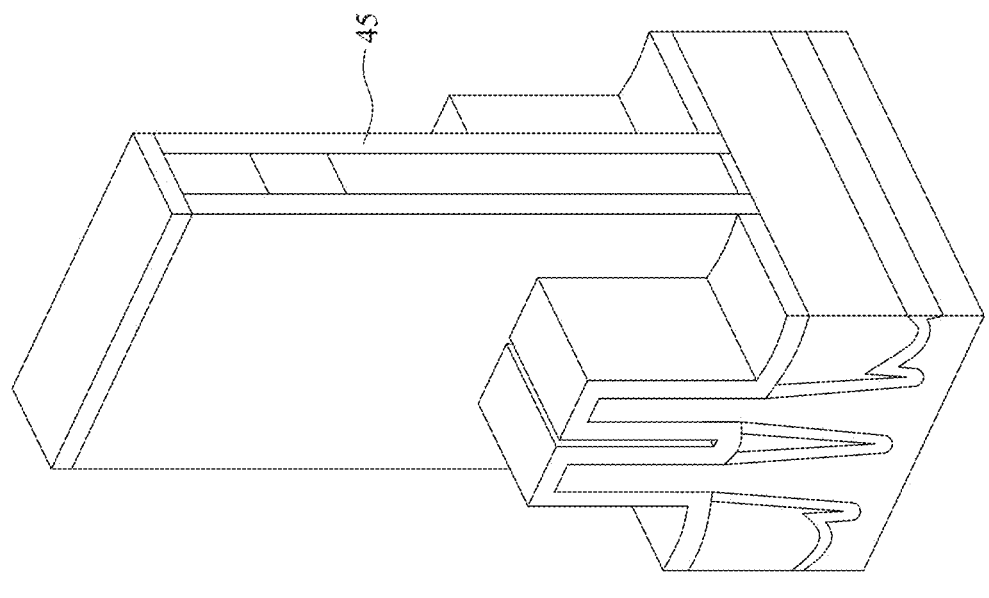
FIG. 7 shows one of the stages of a sequential process for manufacturing a semiconductor device according to an embodiment of the present disclosure.
FIG. 8 shows one of the stages of a sequential process for manufacturing a semiconductor device according to an embodiment of the present disclosure.

FIG. 7 illustrates a structure after a sacrificial gate structure 40 is formed over the exposed fin structures 20. The sacrificial gate structure includes a sacrificial gate electrode 44 and a sacrificial gate dielectric layer 42. The sacrificial gate structure 40 is formed over a portion of the fin structures, which is to be a channel region. The sacrificial gate structure 40 is formed by first blanket depositing the sacrificial gate dielectric layer 42 over the fin structures. A sacrificial gate electrode layer is then blanket deposited on the sacrificial gate dielectric layer and over the fin structures, such that the fin structures are fully embedded in the sacrificial gate electrode layer. The sacrificial gate electrode layer includes silicon such as polycrystalline silicon or amorphous silicon. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. Subsequently, a mask layer is formed over the sacrificial gate electrode layer. The mask layer includes a pad SiN layer 46 and a silicon oxide mask layer 48.

Next, a patterning operation is performed on the mask layer and sacrificial gate electrode layer is patterned into the sacrificial gate structure 40, as shown in FIG. 7. The patterning operations of sacrificial gate structure 40 will be explained below in more detail.

The sacrificial gate structure 40 includes the sacrificial gate dielectric layer 42, the sacrificial gate electrode layer 44 (e.g., poly silicon), the pad SiN layer 46 and the silicon oxide mask layer 48 in some embodiments. By patterning the sacrificial gate structure 40, the upper portions of the fin structures 20 are partially exposed on opposite sides of the sacrificial gate structure 40, thereby defining source/drain (S/D) regions, as shown in FIG. 7. In this disclosure, a source and a drain are interchangeably used and the structures thereof are substantially the same. In FIG. 7, one sacrificial gate structure is formed, but the number of the sacrificial gate structures is not limited to one. Two or more sacrificial gate structures are arranged in the X direction in some embodiments. In certain embodiments, one or more dummy sacrificial gate structures are formed on both sides of the sacrificial gate structures to improve pattern fidelity.

After the sacrificial gate structure 40 is formed, a blanket layer 45 of an insulating material for sidewall spacers 45 is conformally formed by using CVD or other suitable methods, as shown in FIG. 8. The blanket layer 45 is deposited in a conformal manner so that it is formed to have substantially equal thicknesses on vertical surfaces, such as the sidewalls, horizontal surfaces, and the top of the sacrificial gate structure. In some embodiments, the blanket layer 45 is deposited to a thickness in a range from about 2 nm to about 10 nm. In one embodiment, the insulating material of the blanket layer 45 is a silicon nitride-based material, such as SiN, SiON, SiOCN or SiCN and combinations thereof.

Figure 9:
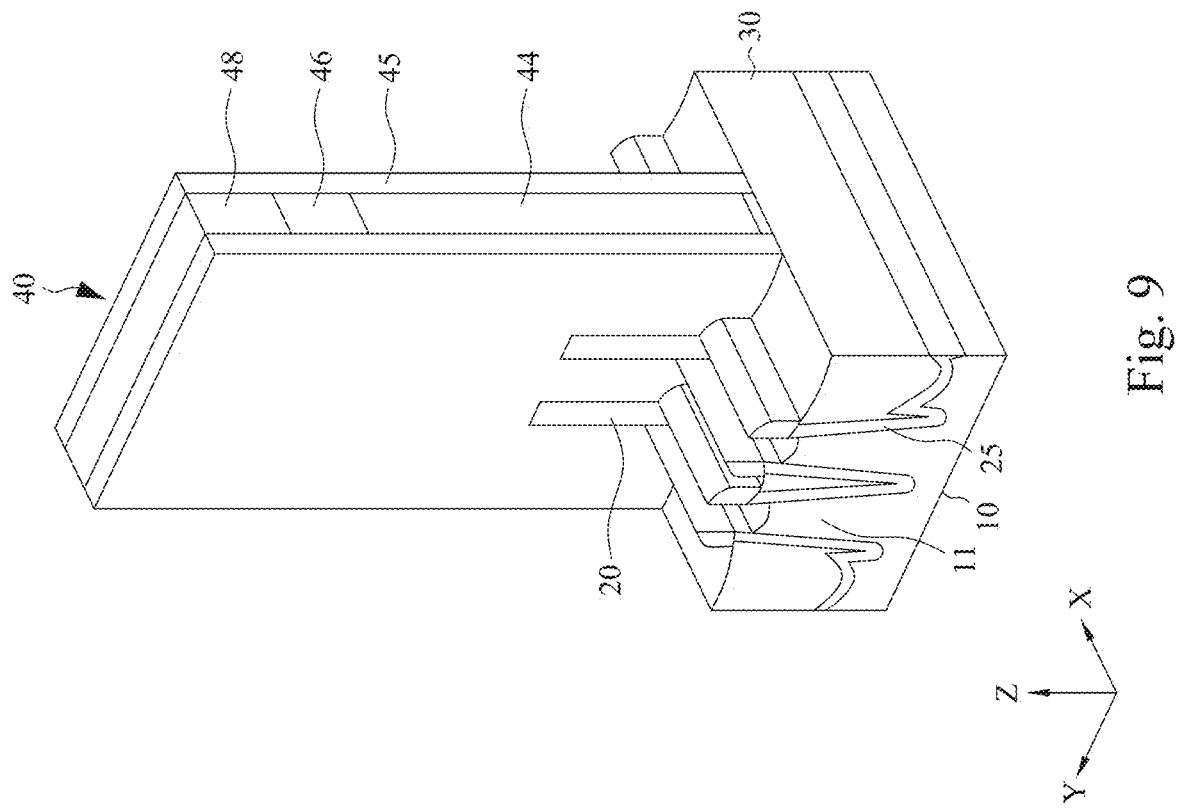
FIG. 9 shows one of the stages of a sequential process for manufacturing a semiconductor device according to an embodiment of the present disclosure.

Further, as shown in FIG. 9, sidewall spacers 45 are formed on opposite sidewalls of the sacrificial gate structures, and subsequently, the fin structures of the S/D regions are recessed down below the upper surface of the isolation insulating layer 30. After the blanket layer 45 is formed, anisotropic etching is performed on the blanket layer 45 using, for example, reactive ion etching (RIE). During the anisotropic etching process, most of the insulating material is removed from horizontal surfaces, leaving the dielectric spacer layer on the vertical surfaces such as the sidewalls of the sacrificial gate structures and the sidewalls of the exposed fin structures. The mask layer 48 may be exposed from the sidewall spacers. In some embodiments, isotropic etching may be subsequently performed to remove the insulating material from the upper portions of the S/D region of the exposed fin structures 20.

Subsequently, the fin structures of the S/D regions are recessed down below the upper surface of the isolation insulating layer 30, by using dry etching and/or wet etching. As shown in FIG. 9, the sidewall spacers 45 formed on the S/D regions of the exposed fin structures (fin sidewalls) partially remain. In other embodiments, however, the sidewall spacers 45 formed on the S/D regions of the exposed fin structures are fully removed. In case of a GAA FET, inner spacers are formed after the recessing the S/D regions.

Figure 10:
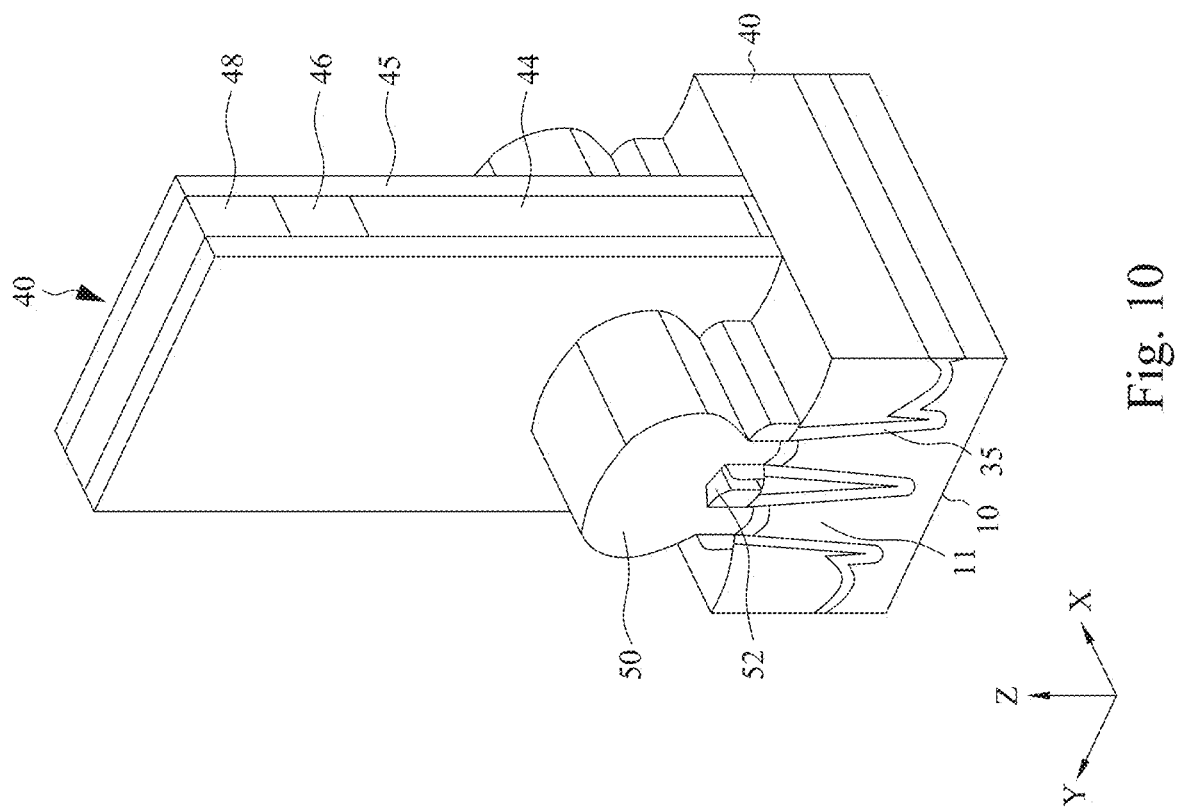
FIG. 10 shows one of the stages of a sequential process for manufacturing a semiconductor device according to an embodiment of the present disclosure.

Subsequently, as shown in FIG. 10, source/drain (S/D) epitaxial layers 50 are formed. The S/D epitaxial layer 50 includes one or more layers of Si, SiP, SiC and SiCP for an n-channel FET or Si, SiGe, Ge, GeSn and SiGeSn for a p-channel FET. The S/D layers 50 are formed by an epitaxial growth method using CVD, ALD or molecular beam epitaxy (MBE).

As shown in FIG. 10, the S/D epitaxial layers grow from the recessed fin structures respectively. The grown epitaxial layers merge above the isolation insulating layer and form a void 52 in some embodiments.

Figure 11:
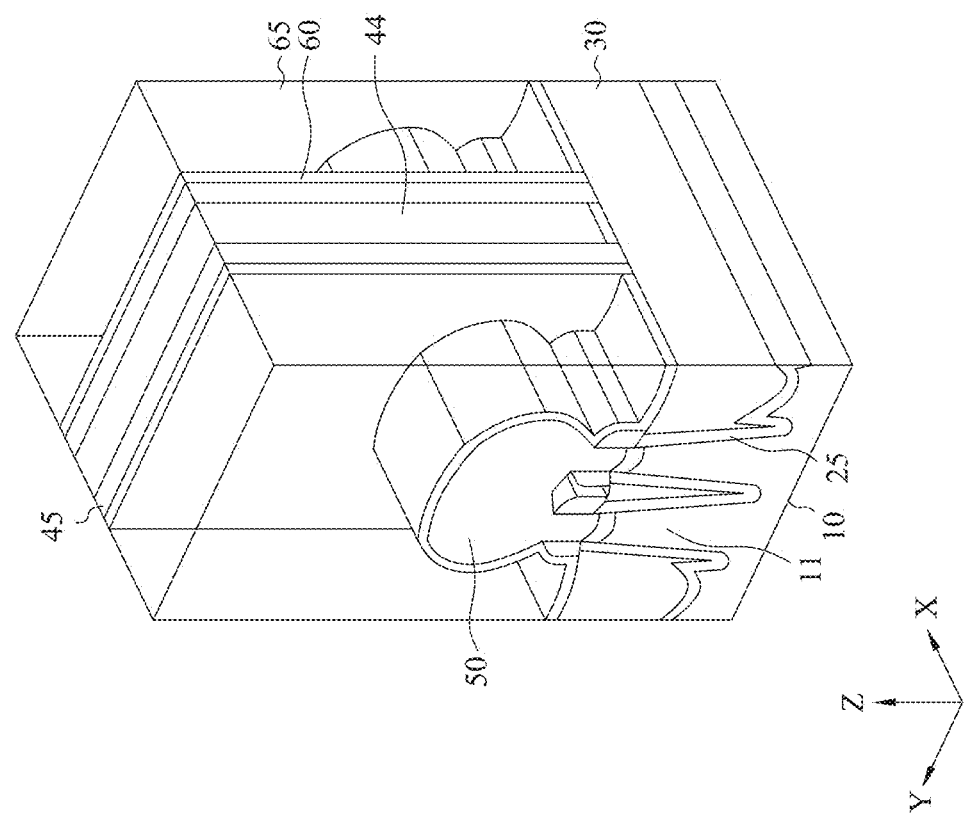
FIG. 11 shows one of the stages of a sequential process for manufacturing a semiconductor device according to an embodiment of the present disclosure.

Subsequently, an insulating liner layer 60, as an etch stop layer, is formed and then an interlayer dielectric (ILD) layer 65 is formed, as shown in FIG. 11. The insulating liner layer 60 is made of a silicon nitride-based material, such as SiN, and functions as a contact etch stop layer in the subsequent etching operations. The materials for the ILD layer 65 include compounds comprising Si, O, C and/or H, such as silicon oxide, SiCOH and SiOC. Organic materials, such as polymers, may be used for the ILD layer 65. After the ILD layer 65 is formed, a planarization operation, such as CMP, is performed, so that the top portion of the sacrificial gate electrode layer 44 is exposed, as shown in FIG. 11.

Figure 12:
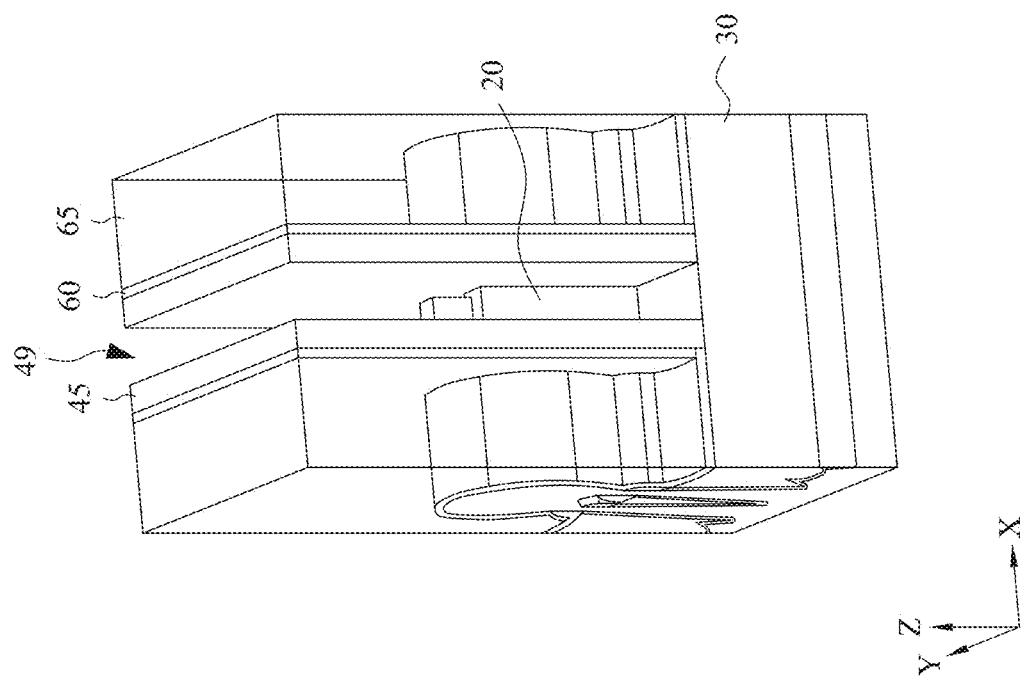
FIG. 12 shows one of the stages of a sequential process for manufacturing a semiconductor device according to an embodiment of the present disclosure.

Next, as shown in FIG. 12, the sacrificial gate electrode layer 44 and sacrificial gate dielectric layer 42 are removed, thereby exposing the fin structures in a gate space 49. The ILD layer 65 protects the S/D structures 50 during the removal of the sacrificial gate structures. The sacrificial gate structures can be removed using plasma dry etching and/or wet etching. When the sacrificial gate electrode layer 44 is polysilicon and the ILD layer 65 is silicon oxide, a wet etchant such as a TMAH solution can be used to selectively remove the sacrificial gate electrode layer 44. The sacrificial gate dielectric layer 42 is thereafter removed using plasma dry etching and/or wet etching.

Figure 13:
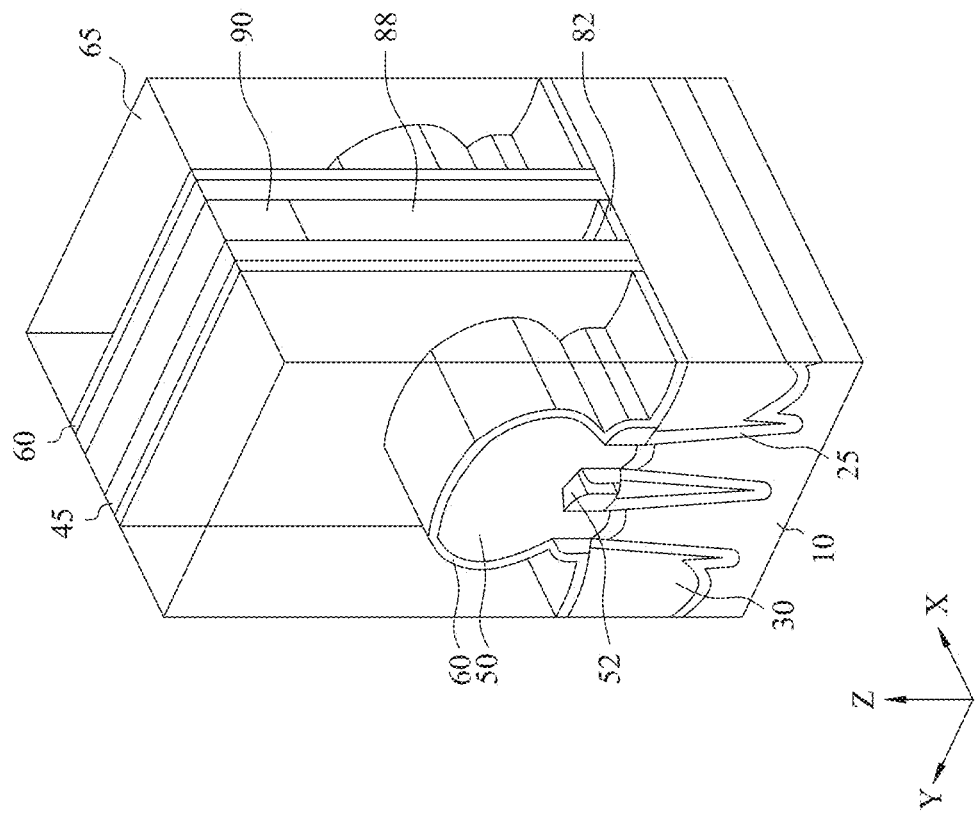
FIG. 13 shows one of the stages of a sequential process for manufacturing a semiconductor device according to an embodiment of the present disclosure.

After the sacrificial gate structures are removed, a gate dielectric layer 82 is formed around the exposed fin structures 20, and a gate electrode layer 88 is formed on the gate dielectric layer 82, as shown in FIG. 13.

In certain embodiments, the gate dielectric layer 82 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 82 includes an interfacial layer formed between the channel layers and the dielectric material.

The gate dielectric layer 82 may be formed by CVD, ALD or any suitable method. In one embodiment, the gate dielectric layer 82 is formed using a highly conformal deposition process such as ALD in order to ensure the formation of a gate dielectric layer having a uniform thickness on the channel regions. The thickness of the gate dielectric layer 82 is in a range from about 1 nm to about 6 nm in some embodiments.

The gate electrode layer 88 is formed on the gate dielectric layer 82. The gate electrode 88 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 88 may be formed by CVD, ALD, electro-plating, or other suitable method. The gate electrode layer is also deposited over the upper surface of the ILD layer 65. The gate dielectric layer and the gate electrode layer formed over the ILD layer 65 are then planarized by using, for example, CMP, until the top surface of the ILD layer 65 is revealed.

After the planarization operation, the gate electrode layer 88 is recessed and a cap insulating layer 90 is formed over the recessed gate electrode 88, as shown in FIG. 13. In some embodiments, the cap insulating layer 90 includes one or more layers of a silicon nitride-based material, such as SiN. The cap insulating layer 90 can be formed by depositing an insulating material followed by a planarization operation.

In certain embodiments of the present disclosure, one or more work function adjustment layers (not shown) are interposed between the gate dielectric layer 82 and the gate electrode 88. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of WN, WCN, W, Ru, Co, TiN or TiSiN is used as the work function adjustment layer. The work function adjustment layer may be formed by ALD, PVD, CVD, e-beam evaporation, or other suitable process. Further, the work function adjustment layer may be formed separately for the n-channel FET and the p-channel FET, which may use different metal layers.

Figure 14:
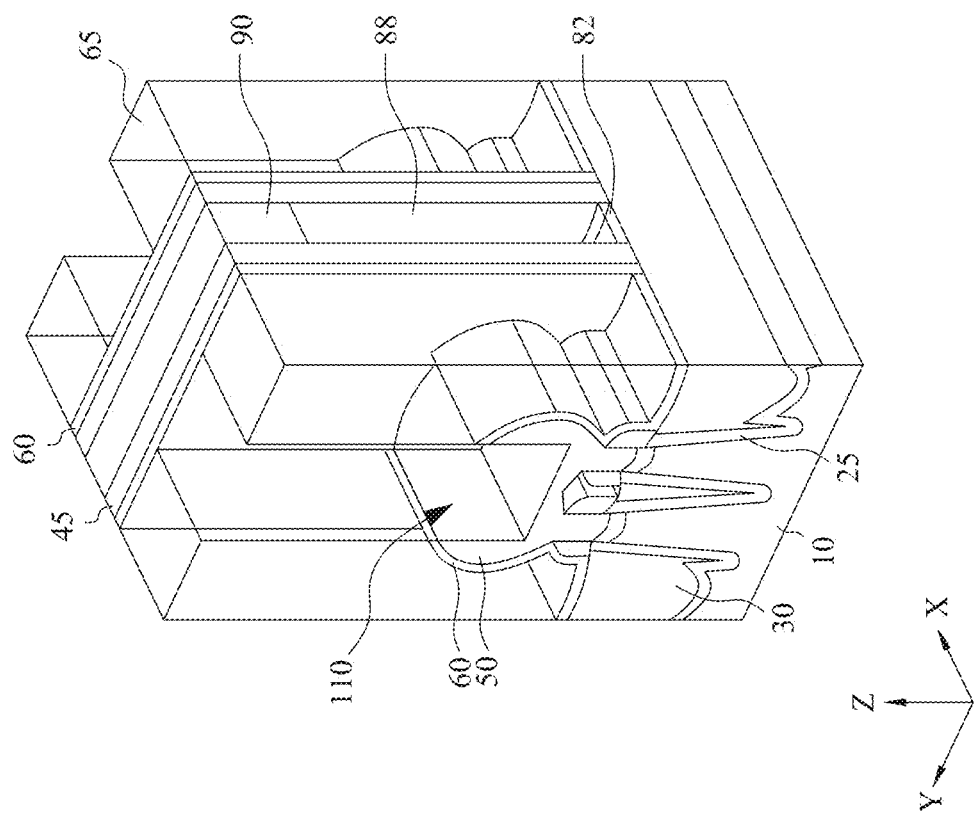
FIG. 14 shows one of the stages of a sequential process for manufacturing a semiconductor device according to an embodiment of the present disclosure.

Subsequently, contact holes 110 are formed in the ILD layer 65 by using dry etching, as shown in FIG. 14. In some embodiments, the upper portion of the S/D epitaxial layer 50 is etched.

Figure 16:
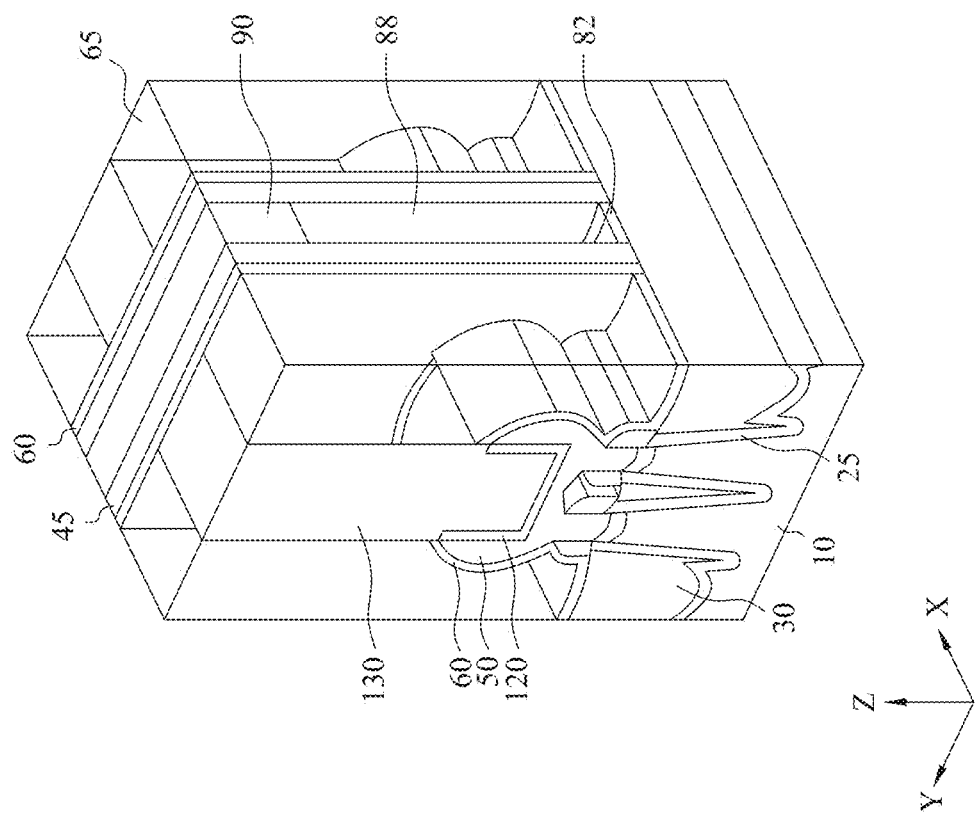
FIG. 16 shows one of the stages of a sequential process for manufacturing a semiconductor device according to an embodiment of the present disclosure.
Figure 15:
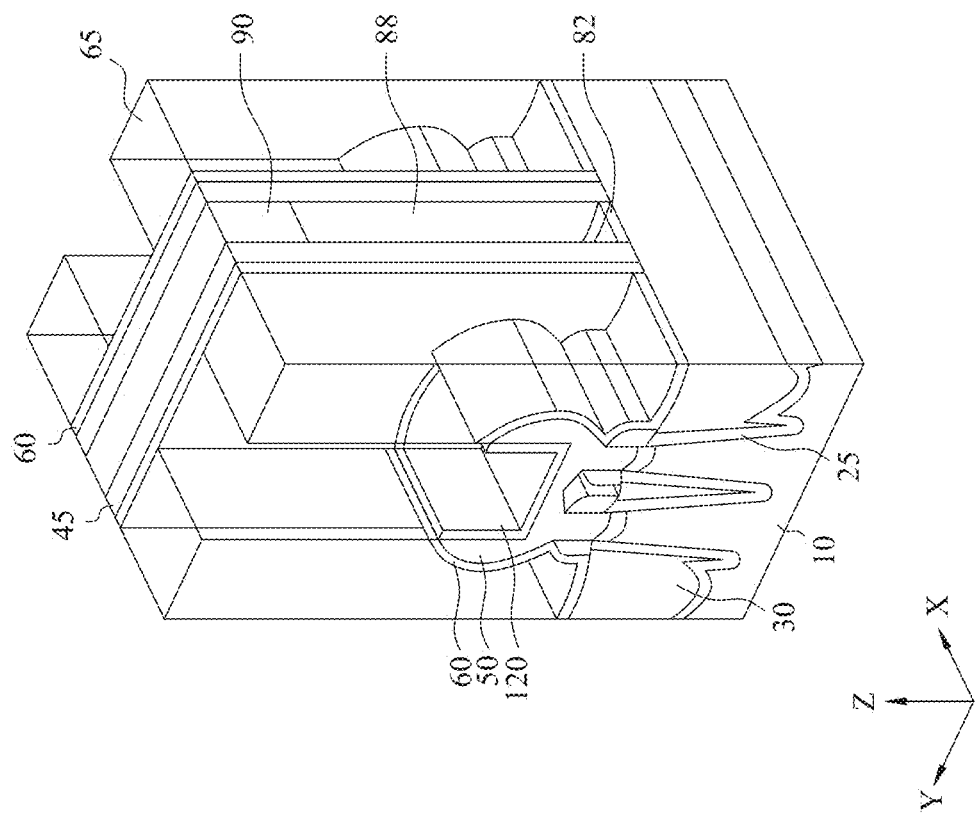
FIG. 15 shows one of the stages of a sequential process for manufacturing a semiconductor device according to an embodiment of the present disclosure.

A silicide layer 120 is formed over the S/D epitaxial layer 50, as shown in FIG. 15. The silicide layer includes one or more of WSi, CoSi, NiSi, TiSi, MoSi and TaSi. Then, a conductive material 130 is formed in the contact holes as shown in FIG. 16. The conductive material 130 includes one or more of Co, Ni. W, Ti, Ta, Cu, Al, TiN and TaN.

It is understood that the FinFETs undergo further CMOS processes to form various features such as contacts/vias, interconnect metal layers, dielectric layers, passivation layers, etc.

FIGS. 17A-18E show various views of a detailed sequential process of FIGS. 11-12 according to an embodiment of the present disclosure. It is understood that additional operations can be provided before, during, and after processes shown by FIGS. 17A-18E, and some of the operations described below can be replaced or eliminated, for additional embodiments of the method. The order of the operations/processes may be interchangeable. Materials, processes, methods, dimensions and/or configurations as explained with the foregoing embodiments may be applied to the following embodiments, and detailed description thereof may be omitted.

After one or more sacrificial gate structures corresponding to FIG. 10 are formed, a first dielectric layer 62 is formed to fully cover the sacrificial gate structures and a second dielectric layer 64 made of a different material than the first dielectric layer 62 is further formed over the first dielectric layer 62, as shown in FIG. 17A. In some embodiments, as shown in FIG. 17A, the sacrificial gate structures include fine patterns corresponding to short channel FETs (e.g., gate length Lg≤20 nm) and coarse or large patterns corresponding to long channel FETs (e.g., 50 nm≤Lg≤500 nm). Further, in some embodiments, a space between adjacent sacrificial gate structures varies between the same width as the fine patterns to about 2-5 times the width of the fine patterns, to between 50 nm to about 500 nm.

In some embodiments, the first dielectric layer 62 is made of a silicon oxide based material, such as silicon oxide, SiON and SiOC. In some embodiments, the second dielectric layer 64 is made of a silicon nitride based material, such as silicon nitride, SiON and SiCN. In some embodiments, the thickness of the second dielectric layer 64 is smaller than the first dielectric layer 62. The first and second dielectric layer are formed by LPCVD, plasma-CVD, ALD or any other suitable film formation methods. In some embodiments, no second dielectric layer is formed.

Then, as shown in FIG. 17B, one or more planarization operations are performed on the first and second dielectric layers to expose the sacrificial gate electrodes 44 (polysilicon layer) of the sacrificial gate structures. In some embodiments, the planarization operation includes a CMP operation. During the planarization operation, the hard mask layers 46 and 48 are also removed.

In some embodiments, the planarization operation includes a first CMP process for mainly etching the second dielectric layer 64 and a subsequent second CMP process for etching the first dielectric layer 62, which ends when the polysilicon layer of the sacrificial gate electrode is exposed.

Next, as shown in FIG. 17C, the remaining first dielectric layer 62 is recessed to expose upper portions of the sacrificial gate structures, by one or more etching (e.g., plasma dry etching) operations. In some embodiments, the recessed amount D11 is about 10% to about 30% of the original depth D10 of the first dielectric layer 62 after the planarization operation, which is also measured from the top of the sacrificial gate structures. In some embodiments, D10 is in a range from about 100 nm to about 200 nm. In some embodiments, D11 is in a range from about 10 nm to about 60 nm and is in a range from about 20 nm to about 35 nm in other embodiments.

Subsequently, as shown in FIG. 17D, a third dielectric layer 66 is formed to fully cover the sacrificial gate structures and a fourth dielectric layer 68 made of a different material than the third dielectric layer 66 is further formed over the third dielectric layer 66.

In some embodiments, the third dielectric layer 66 is made of a silicon nitride based material, such as silicon nitride, SiON and SiCN. In some embodiments, the silicon nitride layer is doped with some impurities (diffusion silicon nitride film). In some embodiments, the fourth dielectric layer 68 is made of a silicon oxide based material, such as silicon oxide, SiON, TEOS and SiOC. The third and fourth dielectric layers are formed by LPCVD, plasma-CVD, ALD, flowable CVD or any other suitable film formation methods. In some embodiments, the deposition temperature is in a range from about 400° C. to about 600° C.

In some embodiments, the thickness of the third dielectric layer 66 is smaller than the fourth dielectric layer 68. In some embodiments, the thickness of the third dielectric layer 66 is in a range from about 50 nm to about 100 nm. In some embodiments, the thickness of the third dielectric layer 66 is 2-3 times the depth of the depth D11. When the thickness is smaller than this range, flatness of the dielectric layers after the subsequent planarization operation (CMP) may be insufficient, and when the thickness is larger than this range, some patterns at lower pattern density may suffer from dishing problems and deposition and/or polishing time may increase, which will increase manufacturing cost. The thickness of the fourth dielectric layer 68 is in a range from about 100 nm to about 200 nm in some embodiments to improve flatness after the subsequent planarization (CMP) process.

Figure 18A:
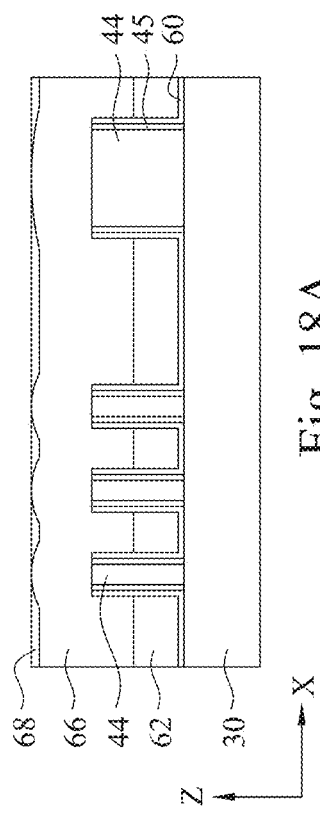
FIGS. 18A, 18B, 18C, 18D and 18E show various stages of a sequential process for manufacturing a semiconductor device according to an embodiment of the present disclosure.
Figure 18B:
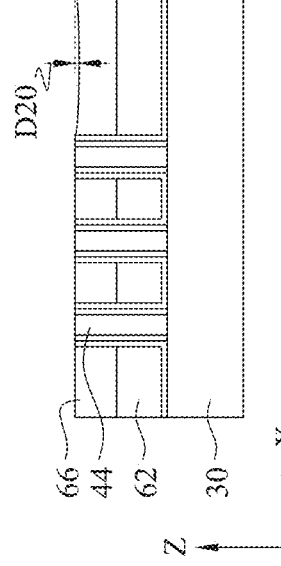
Figure 18C:
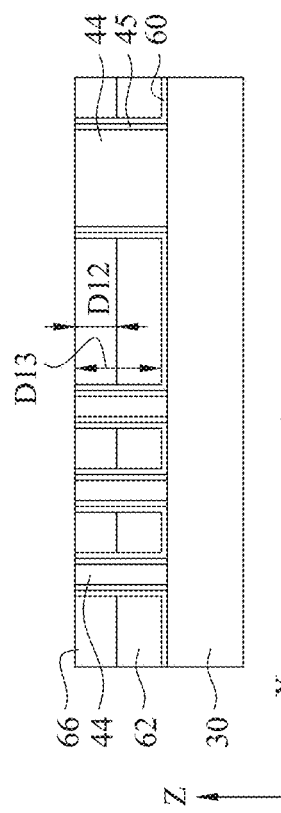

Then, as shown in FIGS. 18A-18C, planarization operations are performed on the first and second dielectric layer to expose the sacrificial gate electrodes 44 of the sacrificial gate structures. The planarization operations include a first CMP process, a second CMP process and a third CMP process sequentially performed in this order, in some embodiments. In the first to third CMP operations, different slurries and/or CMP pads are used.

In the first CMP operation, the fourth dielectric layer 68 is mainly etched. The first CMP operation stops at the surface of the third dielectric layer 66 by employing an end point detection technique. In some embodiments, a down force of the CMP head is relatively low, in a range from about more than 0.1 and up to about 2 psi, for all zones to detect the end point and stop on the third dielectric layer 66 to suppress the dishing problem. When the down force is higher than this range, dishing problems may occur in an oxide rich-area. In some embodiments, the slurry used in the first CMP operation includes an abrasive containing $CeO_2$, which etches silicon oxide at a high etching rate (e.g., 30-160 nm/min) and does not substantially etch silicon nitride.

In some embodiments, an additional over-polishing (over-etching) is performed for about 10-30 seconds after the endpoint is detected. As shown in FIG. 18A, residual portions of the fourth dielectric layer remain due to the topography of the upper surface of the third dielectric layer 66 in some embodiments.

The second CMP operation mainly etches the third dielectric layer 66 and stops on the sacrificial gate electrode layer 44 (polysilicon layer) by employing an end point detection technique. In some embodiments, a down force of the CMP head is relatively low in a range from about more than zero and up to about 3 psi. In some embodiments, an additional over-polishing is performed for about 5-15 seconds (or about 3-9% of the main etching time) after the endpoint is detected. When the over-polishing time is too short, the third dielectric layer 66 may remain on the sacrificial gate electrode 44, and when the over-polishing time is too long, a dishing problem at a large space portion (see, FIG. 18D) may occur. In some embodiments, in the second CMP operation, the sacrificial gate electrode layer 44 is slightly etched in an amount of 0.5 nm to about 2.5 nm.

The third CMP operation etches both the third dielectric layer 66 and the sacrificial gate electrode layer 44 in some embodiments. The third CMP operation is controlled by time. In some embodiments, the etching time of the third CMP operation is in a range from about 5 sec to about 15 sec. In some embodiments, in the second CMP operation, the sacrificial gate electrode layer 44 is etched in an amount of 0.5 nm to about 5 nm. In some embodiments, the remaining third dielectric layer 66 after the third CMP process is in a range from about 15 nm to about 30 nm. The structure of FIG. 18C corresponds to the structure of FIG. 11 and the ILD layer 65 includes the first dielectric layer 62 and the remaining third dielectric layer 66. In some embodiments, the slurry used in the third CMP has a relatively high etching rate of silicon nitride (e.g., 20-50 nm/min) and relatively low polysilicon etching rate. In some embodiments, the thickness D12 of the remaining third dielectric layer is about 10% to about 30% of the height D13 of the sacrificial gate structure from the upper surface of the isolation insulating layer, which is about 90 nm to about 180 nm in some embodiments. In some embodiments, D12 is in a range from about 9 nm to about 54 nm and is in a range from about 20 nm to about 35 nm in other embodiments.

Figure 18D:
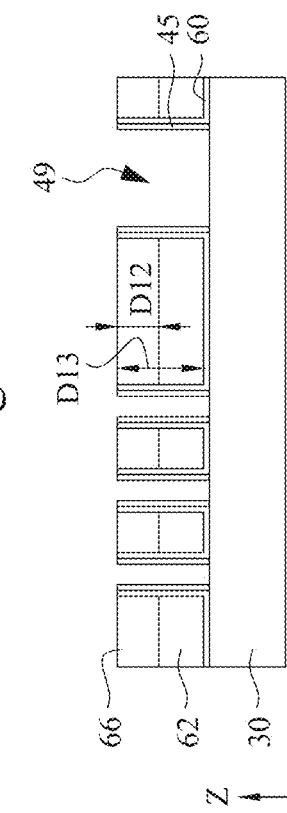

In some embodiments, in a large space portion or coarse pattern portion (distance between adjacent sacrificial gate structures is about 50 nm or more (up to, for example, about 500 nm)) between the sacrificial gate structures, dishing may be observed as shown in FIG. 18D. In some embodiments, the dishing amount D20 measured from the top of the adjacent sacrificial gate structures is in a range from about 1 nm to about 5 nm. In some embodiments, the difference between the maximum thickness (observed at, e.g., dense pattern) and the minimum thickness (observer at, e.g., coarse patterns) of the remaining third dielectric layer 66 is in a range from about 2 nm to about 10 nm.

In the first to third CMP processes, CMP pads having high or medium hardness (e.g., hardness >50 (Shore D) are used for high planarization efficiency. When the hardness is less than about 50, the polishing may not yield good planarization efficiency, the dishing effect may occur at a low density pattern region, and the third dielectric layer 66 on the first dielectric layer 62 may be removed due to the dishing effect and then would not be able to protect the dielectric layer 62 in subsequent processes. Further, in the first to third CMP processes, since the CMP process mainly etches silicon nitride, a post CMP cleaning process may be performed. The post CMP cleaning process includes a pre-clean process (e.g., platen buffing), an ultrasonic (mega sonic) wafer cleaning process, a brush conditioning process, and an IPA (isopropanol) cleaning process. The brush conditioning process includes a first step and a second step in some embodiments. In some embodiments, the first step includes the use of an acid solution buffing operation with one or more chelating agents to capture metal ions during the polishing, and the second step includes a base solution (e.g., $NH_4OH$) to remove excessive organic materials.

Figure 18E:
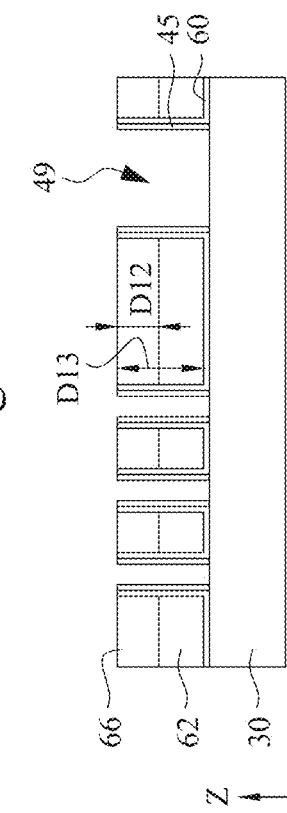

After the CMP operations, similar to FIG. 12, the sacrificial gate electrode layer 44 and sacrificial gate dielectric layer 42 are removed, to form gate spaces 49, as shown in FIG. 18E.

The foregoing planarization operations of FIGS. 17A-18C can be applied to planarization operations for other underlying structures, such as fin structures, metal gate electrodes, and contact and wiring structures.

FIGS. 19A-28 show various views of a detailed sequential process of FIGS. 17B-18E according to an embodiment of the present disclosure. It is understood that additional operations can be provided before, during, and after processes shown by FIGS. 19A-28, and some of the operations described below can be replaced or eliminated, for additional embodiments of the method. The order of the operations/processes may be interchangeable. Materials, processes, methods, dimensions and/or configurations as explained with the foregoing embodiments may be applied to the following embodiments, and detailed description thereof may be omitted.

FIGS. 19A and 19B show a perspective view and a plan view after the sacrificial gate structures 40 (sacrificial gate electrode 44 and sacrificial gate dielectric layer 42) are removed, respectively. In some embodiments, one or more sacrificial gate structures 40 are formed to fully overlap one or more fin structures 20, and a sacrificial gate structure 40 is formed on an edge of the fin structure to cover the edge of the fin structure.

Figure 20:
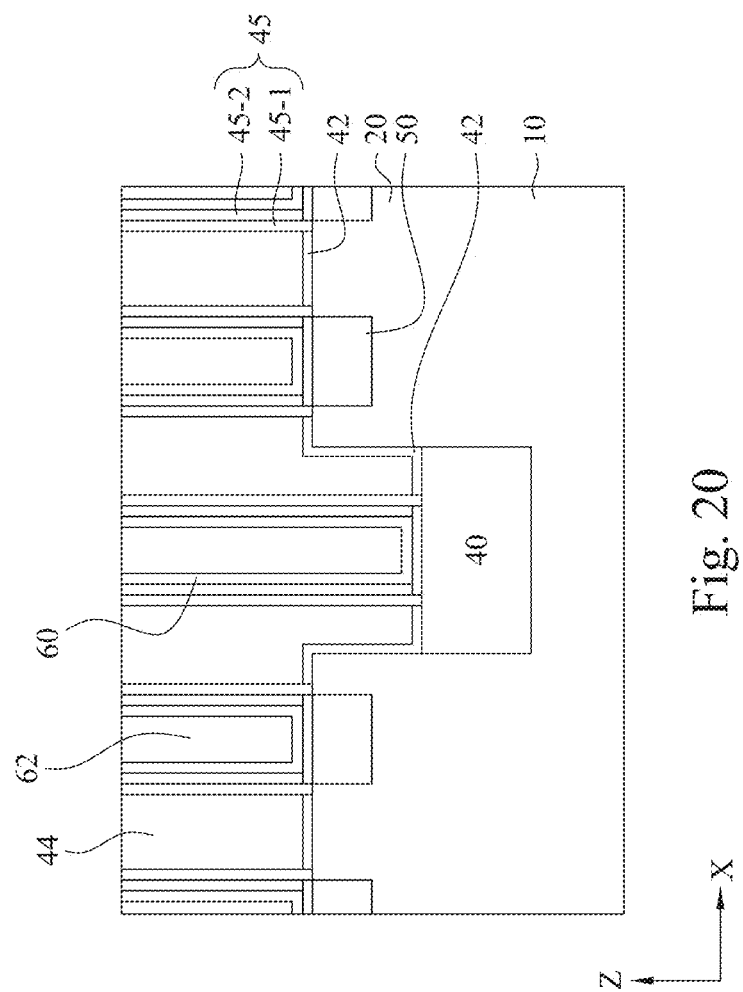
FIG. 20 shows one of the stages of a sequential process for manufacturing a semiconductor device according to an embodiment of the present disclosure.

FIG. 20 shows a cross section view showing sacrificial gate structures fully overlapping the fin structure and a sacrificial gate structure over the edge of the fin structure 20, after the insulating liner layer 60 (an etch stop layer) and the ILD layer 62 are formed, similar to FIG. 17B. In some embodiments, the gate sidewall spacers 45 include first sidewall spacers 45-1 formed on side faces of the sacrificial gate electrode layer 44 and second sidewall spacers 45-2 made of a different material than the first sidewall spacers 45-1 formed over the first sidewall spacers 45-1, as shown in FIG. 20. In some embodiments, the second sidewall spacers 45-2 are continuously formed between the adjacent sacrificial gate structures as shown in FIG. 20, and in other embodiments, the second sidewall spacers 45-2 have no bottom portion between the adjacent sacrificial gate structures. In some embodiments, the sacrificial gate dielectric layer 42 extends below the first and/or second sidewall spacers.

In some embodiments, the first sidewall spacers 45-1 are made of an insulating material having a higher nitrogen concentration (and a lower oxide concentration) than an insulating material of the second sidewall spacers 45-2. In some embodiments, the first and second sidewall spacers include one or more of SiOCN, SiCN, SiN, SiON, SiOC or any other suitable insulating materials. In some embodiments, the thickness of the first sidewall spacer and the second sidewall spacer is in a range from about 1 nm to about 10 nm, respectively, depending on the design and/or process requirements.

Figure 21A:
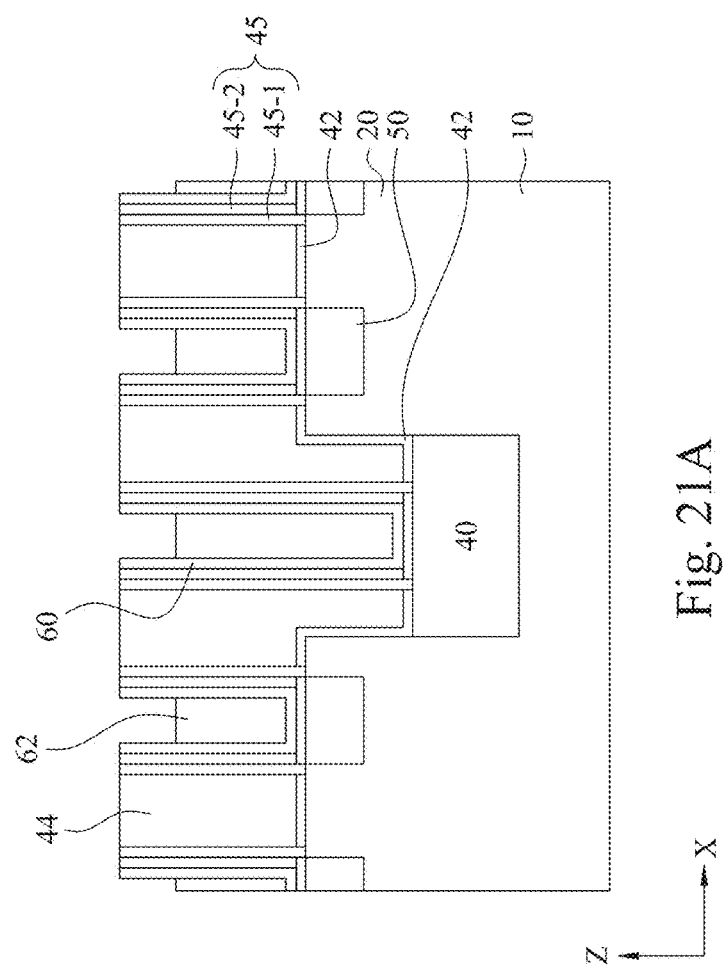
FIGS. 21A, 21B and 21C show one of the stages of a sequential process for manufacturing a semiconductor device according to an embodiment of the present disclosure.
Figure 21B:
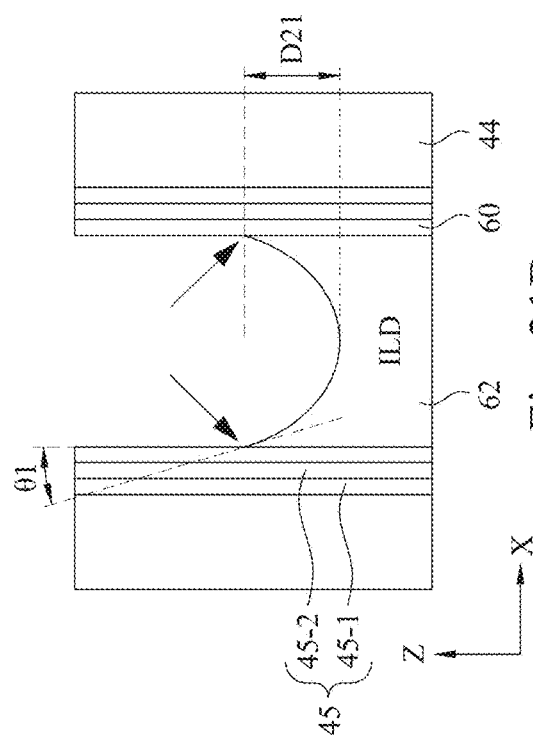

FIG. 21A shows a cross sectional view corresponding to FIG. 17C after the remaining first dielectric (ILD) layer 62 is recessed to expose upper portions of the sacrificial gate structures. In some embodiments, the recess etching of the ILD layer 62 includes two or more etching processes, e.g., a first etching process and a second etching process subsequent to the first etching process, with different etching conditions from each other. In some embodiments, the first etching process is a chemical dry etching process without using plasma. The source gas for the chemical dry etching includes HF and $NH_3$. In some embodiments, an etching selectivity (etching rate ratio) of silicon oxide (ILD 62) to silicon nitride is about 40:1 to about 60:1. FIG. 21B shows an enlarged cross-sectional view of the upper surface of the etched ILD layer 62 after the first etching process. As shown in FIG. 21B, the center portion of the ILD layer 62 is etched more than the edge portions and the upper surface of the etched ILD layer 62 has a large peak-to-valley distance D21. In some embodiments, the peak-to-valley distance D21 (a distance between the highest point and the lowest point) of the ILD 62 is in a range from about 2 nm to about 15 nm. In some embodiments, an angle $\theta 1$ between the upper surface of the ILD layer 62 and a side face of the second sidewall spacer 45-2 at the highest contacting point of the ILD layer 62 to the second sidewall spacer 45-2 is in a range from about 10 degrees to about 50 degrees, and is in a range from about 20 degrees to about 30 degrees in other embodiments.

Figure 21C:
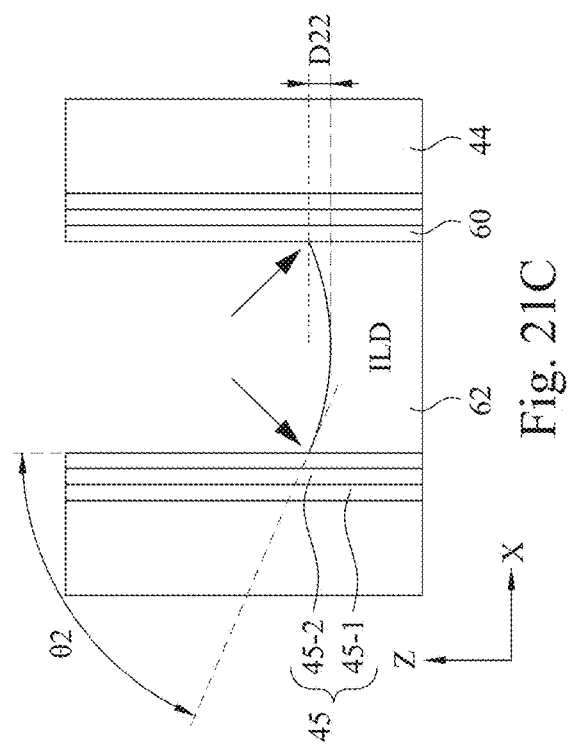

In some embodiments, the second etching process is a plasma dry etching process. The source gas for the chemical dry etching includes $NF_3$ and $H_2$. In some embodiments, the plasma process uses a remote plasma source. In some embodiments, an etching selectivity (etching rate ratio) of silicon oxide (ILD 62) to silicon nitride is about 3:1 to about 5:1. FIG. 21C shows an enlarged cross-sectional view of the upper surface of the etched ILD layer 62 after the second etching process. As shown in FIG. 21C, the edge portions are etched to reduce the peak-to-valley distance. In some embodiments, the peak-to-valley distance D22 after the second etching process is smaller than D21 and is in a range from about 1 nm to about 10 nm. In some embodiments, an angle $\theta 2$ between the upper surface of the ILD layer 62 and a side face of the second sidewall spacer 45-2 at the highest contacting point of the ILD layer 62 to the second sidewall spacer 45-2 is in a range from about 60 degrees to about 95 degrees, and is in a range from about 70 degrees to about 90 degrees.

FIGS. 22A and 22B show cross sectional views corresponding to FIGS. 18B-18D after the third dielectric layer 66 is formed.

Figure 23B:
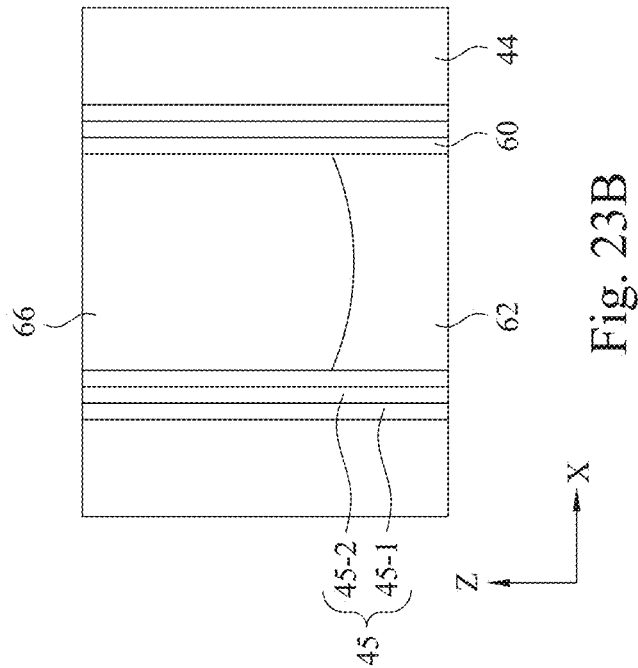
FIGS. 23A and 23B show one of the stages of a sequential process for manufacturing a semiconductor device according to an embodiment of the present disclosure.
Figure 23A:
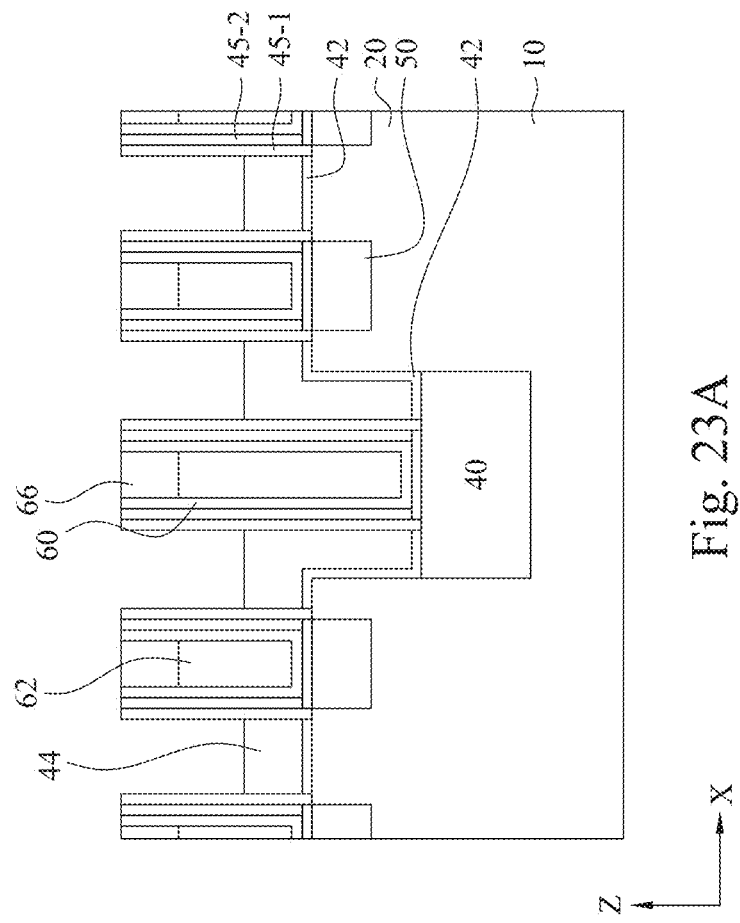

FIGS. 23A and 23B show cross sectional views after the sacrificial gate electrode layer 44 is partially recessed. In some embodiments, a plasma dry etching process is used to remove the sacrificial gate electrode layer 44. In some embodiments, about 40% to about 70% in height above the upper surface of the fin structure 20 of the sacrificial gate electrode layer 44 is recessed (etched).

FIGS. 24A and 24B show cross sectional views after the gate sidewall spacers 45 are partially recessed. In some embodiments, the first sidewall spacers 45-1 are recessed to the substantially same level as the recessed sacrificial gate electrode layer 44 (±about 5 nm). In some embodiments, the second sidewall spacers 45-2 are also partially recessed. The recessed amount of the second sidewall spacers 45-2 is smaller than the recessed amount of the first sidewall spacers 45-1 and is about 20% to about 40% of the recessed amount of the first sidewall spacers.

Figure 25B:
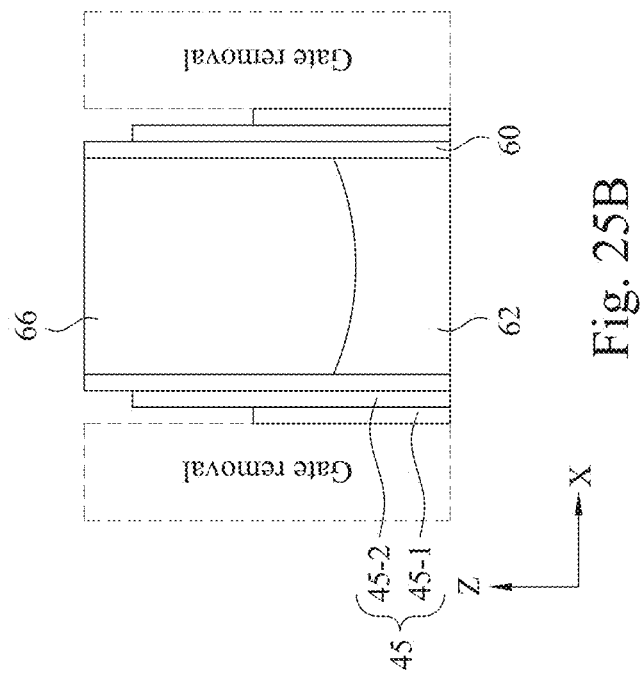
FIGS. 25A and 25B show one of the stages of a sequential process for manufacturing a semiconductor device according to an embodiment of the present disclosure.
Figure 25A:
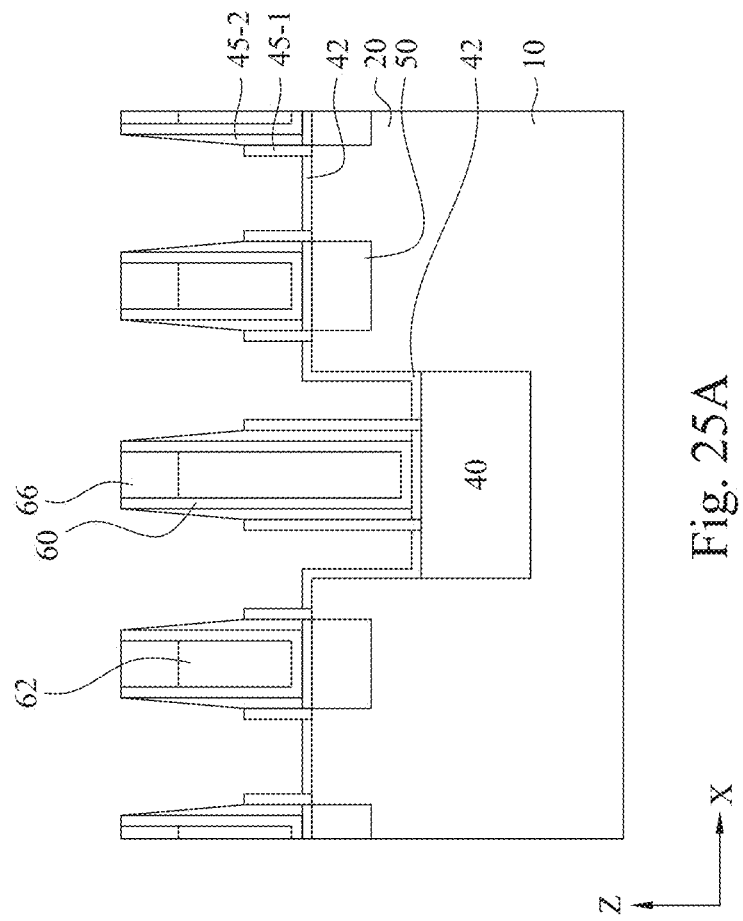

FIGS. 25A and 25B show cross sectional views corresponding to FIG. 18E after the sacrificial gate electrode layer 44 is fully removed. In some embodiments, a plasma dry etching process and/or a wet etching process are used to remove the sacrificial gate electrode layer 44.

Figure 26B:
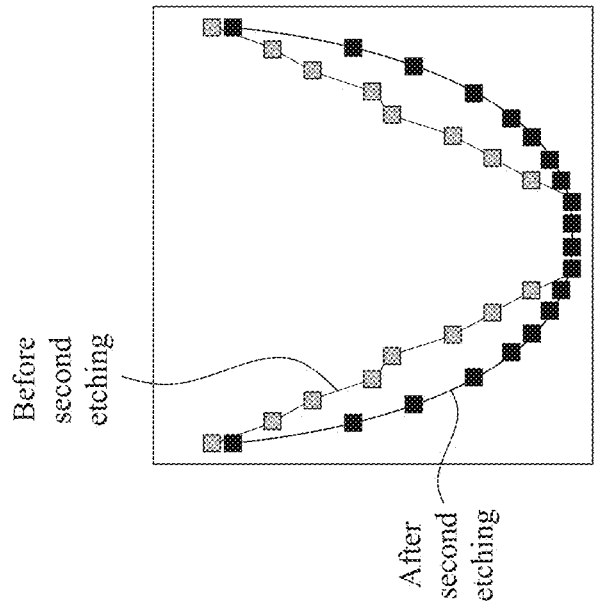
FIG. 26B shows surface profile before and after an additional etching operation according to an embodiment of the present disclosure.
Figure 26A:
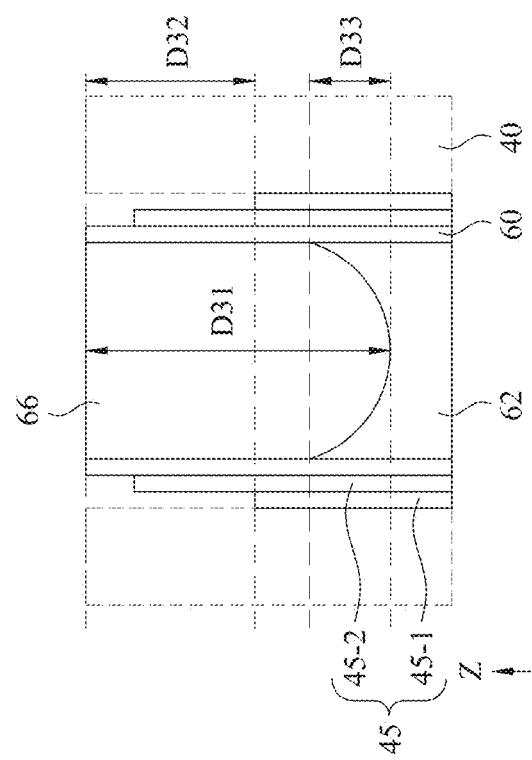
FIG. 26A shows one of the stages of a sequential process for manufacturing a semiconductor device according to an embodiment of the present disclosure.

FIG. 26A shows an enlarged view of the third insulating layer 66 and the gate sidewall spacers. In some embodiments, the dimension D33 is smaller than dimensions D31-D32, where the dimension D31 is a largest thickness of the third insulating layer 66 above the ILD layer 62, the dimension D32 is a recess amount of the second sidewall spacers 45-2 and the dimension D33 is a peak-to-valley distance of the upper surface of the ILD layer 62. When the dimensions do not satisfy D33<D31-D32, the metal gate electrode 88 (shown in FIGS. 13-16) may have a horn profile which may degrade device performance and/or process margins.

FIG. 26B shows a profile comparison of the upper surface of the ILD layer 62 before and after the second etching process. The vertical axis is normalized. As shown in FIG. 26B, the steep V-shape profile is relaxed to the U-shape profile by the second etching process as set forth above.

Figure 27:
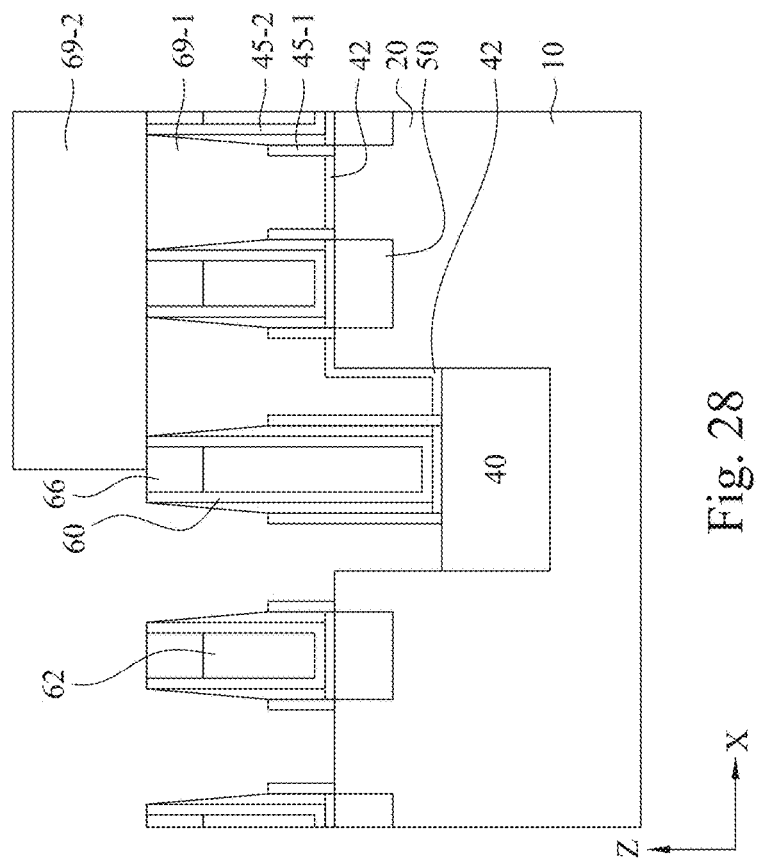
FIGS. 27 and 28 show various stages of a sequential process for manufacturing a semiconductor device according to an embodiment of the present disclosure.
Figure 28:
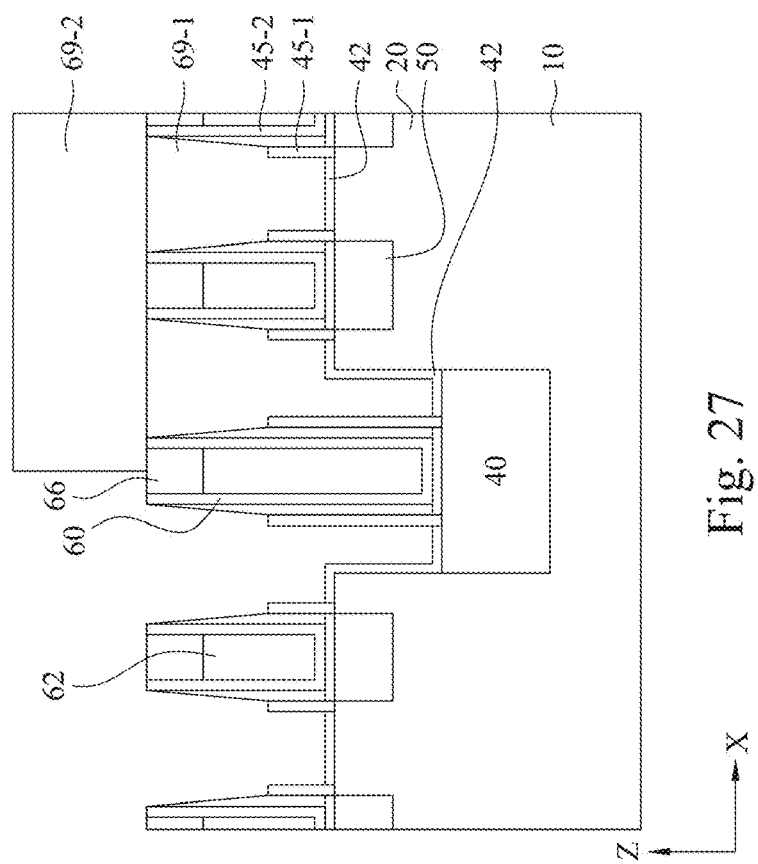

After the sacrificial gate electrode 44 is fully removed, an I/O region having a larger gate length is covered by a cover layer 69-1 and a mask layer 69-2 are formed in the I/O region, as shown in FIG. 27. In some embodiments, the cover layer 69-1 is made of a dielectric material and the mask layer 69-2 is a photo resist pattern. Then, as shown in FIG. 28, the sacrificial gate dielectric layer 42 in the core region having a smaller gate length is removed. Subsequently, the mask layer 69-2 and the cover layer 69-1 are removed, and metal gate structures as explained with respect to FIG. 13 are formed in the core region and the I/O region, respectively.

FIGS. 29A-32C show various views of a detailed sequential process of FIGS. 12-13 according to an embodiment of the present disclosure. It is understood that additional operations can be provided before, during, and after processes shown by FIGS. 29A-32C, and some of the operations described below can be replaced or eliminated, for additional embodiments of the method. The order of the operations/processes may be interchangeable. Materials, processes, methods, dimensions and/or configurations as explained with the foregoing embodiments may be applied to the following embodiments, and detailed description thereof may be omitted.

Figure 29B:
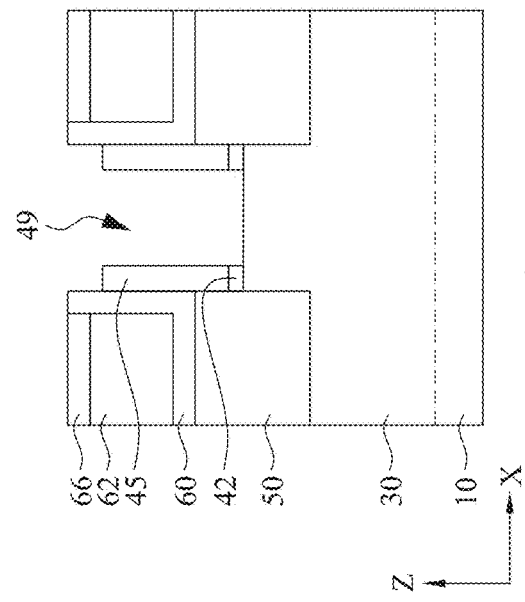
FIGS. 29A, 29B, 29C and 29D show one of the various stages of a sequential process for manufacturing a semiconductor device according to an embodiment of the present disclosure.
Figure 29C:
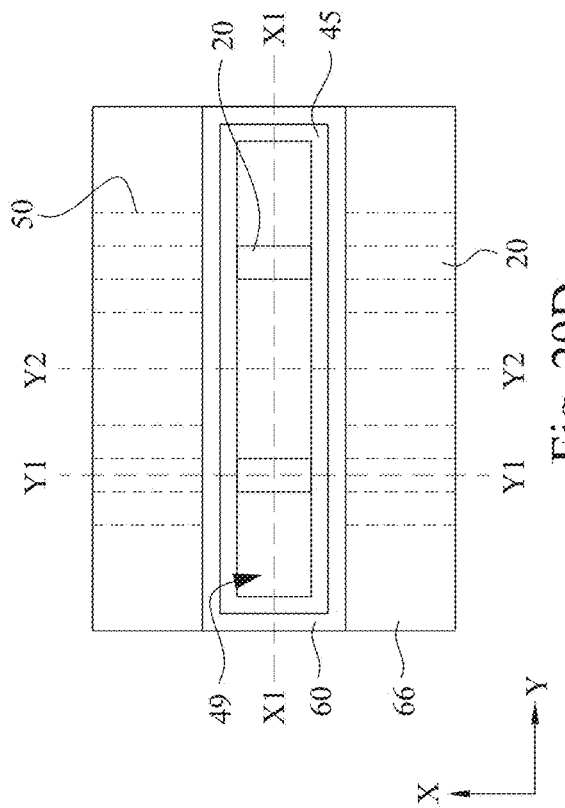
Figure 29A:
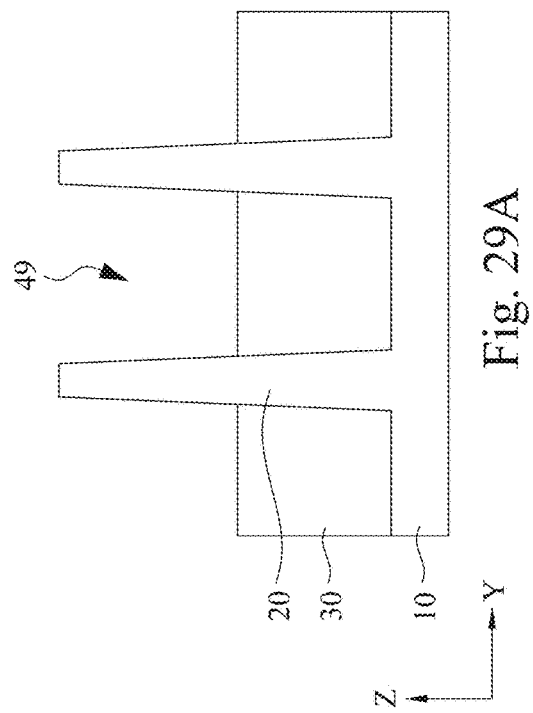
Figure 29D:
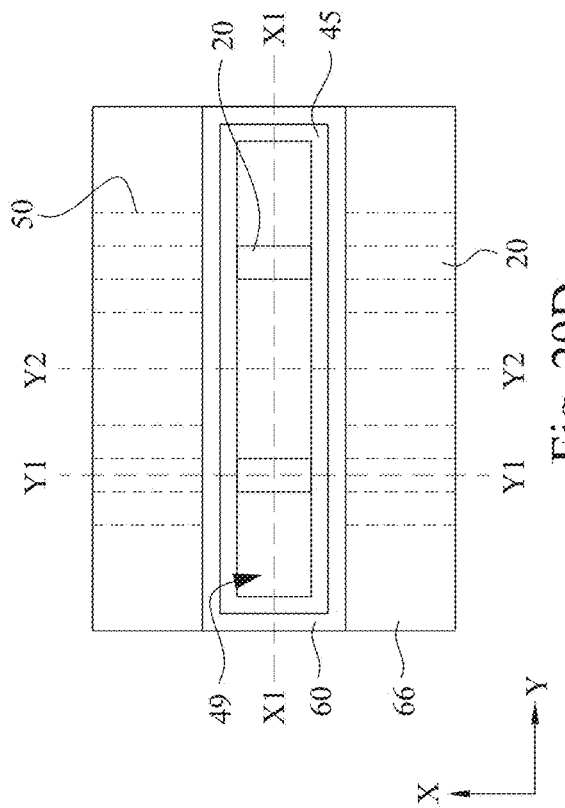

FIGS. 29A-29D show various views after the sacrificial gate structure (sacrificial gate electrode 44 and sacrificial gate dielectric layer 42) are removed, thereby forming a gate space 49, as described with reference to FIG. 12. FIG. 29A is a cross sectional view along X1-X1 of FIG. 29D (a plan or projected view), FIG. 29B is a cross sectional view along Y1-Y1 of FIG. 29D and FIG. 29C is a cross sectional view along Y2-Y2 of FIG. 29D. In some embodiments, an insulating liner layer 60 functioning as an etching stop layer is formed before the ILD layer 65 is formed. In some embodiments, the insulating liner layer 60 includes silicon nitride.

In some embodiments, an upper portion of the gate sidewall spacer 45 is recessed as shown in FIGS. 29B and 29C. In some embodiments, the gate sidewall spacers 45 are recessed during the removal of the sacrificial gate dielectric layer, and in other embodiments, one or more dry and/or wet etching operations are performed to recess the gate sidewall spacers 45. In some embodiments, after the gate sidewall spacers 45 are recessed, the uppermost surface is made of only a silicon nitride based material (e.g., silicon nitride) (layers 60 and 66).

FIGS. 30A, 30B and 30C are enlarged views of the gate spaces after the metal gate structures are formed. FIG. 30A corresponds to a short channel FET including gate electrodes of static random access memory (SRAM) cells (e.g., 4 nm≤Lg≤10 nm), FIG. 30B corresponds to a middle channel FET including gate electrodes of logic circuits (e.g., 12 nm≤Lg≤20 nm), and FIG. 30C corresponds to a long channel FET (50 nm≤Lg≤500 nm).

As shown in FIGS. 30A-30C, an interfacial layer 81 is formed on the channel regions of the fin structures 20 and a gate dielectric layer 82 is formed over the interfacial layer and inner wall of the gate sidewall spacers 45. In some embodiments, the gate dielectric layer 82 is formed over the upper surfaces of the etching stop layer 60 and the additional dielectric layer 66. The gate dielectric layer 82 is formed by an ALD process in some embodiments to conformally form a layer over a high aspect ratio structure. In some embodiments, the aspect ratio (height/bottom diameter or area) of the gate space 49 is in a range from about 7 to about 25.

Then, a barrier layer 83 is formed over the gate dielectric layer 82. In some embodiments, the barrier layer 83 includes one or more layers of Ta, TaN, Ti, TiN or TiSiN. In some embodiments, the thickness of the barrier layer is in a range from about 1 nm to about 3 nm. In some embodiments, the barrier layer 83 is not formed. In some embodiments, the thickness of the barrier layer 83 at the bottom is thicker than the thickness at the sides. In some embodiments, the thickness of the barrier layer 83 at the bottom is about 0.5 times to three times the thickness at the sides.

Further, one or more first work function adjustment material (WFM) layers are formed over the barrier layer 83. In some embodiments, the first WFM layer 84 is a p-type WFM material, such as WN, WCN, W, Ru, Co, TiN or TiSiN. In some embodiments, the thickness of the first WFM layer is in a range from about 0.5 nm to about 10 nm and is in a range from about 1 nm to about 2 nm in other embodiments. In some embodiments, the thickness of the first WFM layer 84 at the bottom is about 0.8 times to twice the thickness at the side. When the first WFM layer is made of TiN, the TiN layer is formed from source gases including TiCl$_4$ and NH$_3$. In some embodiments, the TiN layer contains Cl as an impurity. In some embodiments, the Ti concentration in the TiN layer is in a range from about 10 atomic % to about 80 atomic %. When the Ti concentration is too small, the resistance of the TiN layer increases, and when the Ti concentration is too high, Ti diffusion may cause various problems (e.g., punch-through).

Further, one or more second WFM layers 85 are formed over the first WFM layer 84. In some embodiments, the second WFM layer 85 is an n-type WFM material, such as TiAl, TiSiAl, TiAlC, TaAl or TaAlC. In some embodiments, the thickness of the second WFM layer is in a range from about 0.5 nm to about 6 nm and is in a range from about 2 nm to about 5 nm in other embodiments. In some embodiments, the thickness of the second WFM layer 85 at the bottom is the same as or up to three times the thickness at the side. After the WFM layers are formed, a body metal layer 86 is formed over the WFM layers. In some embodiments, a glue layer (not shown) is formed over the WFM layers before the body metal layer is formed. In some embodiments, the glue layer includes one or more of Ta, WCN, TaN, Ti, TiN or TiSiN. The body metal layer 86 includes W, Ta, Sn, Nb, Ru, Co or Mo. In certain embodiments, W is used. In some embodiments, the body metal layer 86 is formed by an ALD process using metal halide (chloride) gases (e.g., $WCl_5$, $TaCl_5$, $SnCl_4$, $NbCl_5$ or $MoCl_4$). In some embodiments, the body metal layer 86 includes fluorine-free metal, for example, fluorine-free W formed by $WCl_5$ as a source gas. In some embodiments, in an n-type FET, the first WFM layer (p-type material layer) is not formed.

In some embodiments, as shown in FIG. 30A, the second WFM layer 85 fully fills the gate space and no body metal layer (e.g., W layer) is formed in the gate space. Further, in some embodiments, the conductive layers are conformally formed in the gate space and thus do not fully fill the gate space for a long channel FET as shown in FIG. 30C. In such a case, one or more insulating layer 89 is formed to fill the remaining space of the gate space, as shown in FIG. 30C. The insulating layer 89 is formed by one or more deposition and CMP operations. In some embodiments, the insulating layer 89 includes silicon nitride.

Figure 31A:
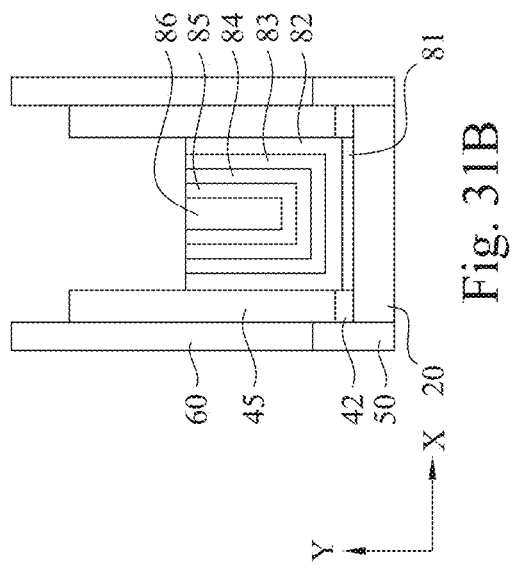
FIGS. 31A, 31B and 31C show one of the various stages of a sequential process for manufacturing a semiconductor device according to an embodiment of the present disclosure.
Figure 31B:
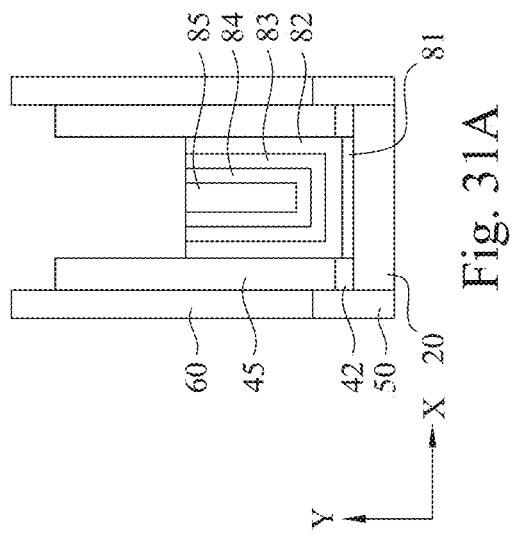
Figure 31C:
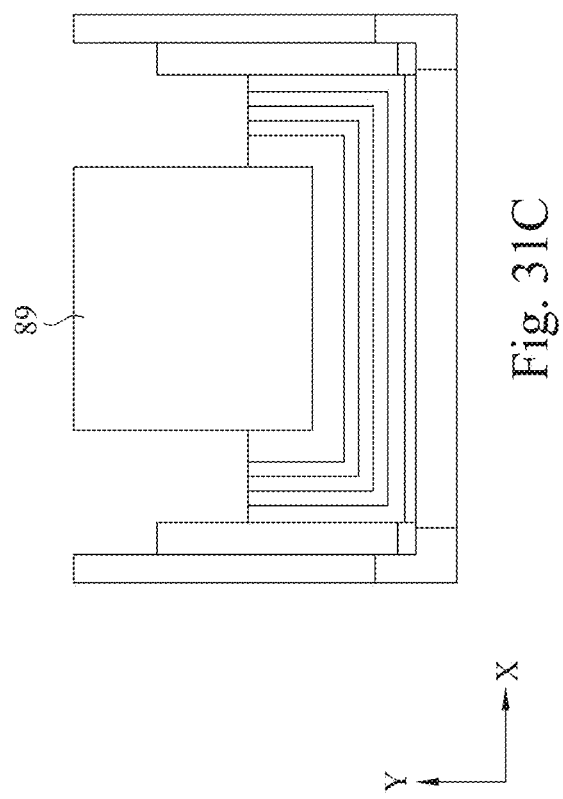

Then, as shown in FIGS. 31A-31C, an upper portion of the conductive layer formed in the gate space is recessed by one or more etching operations. In some embodiments, in the etching operations, an upper part of the sidewall spacers 45 and/or an upper portion of the gate dielectric layer 82 are also etched. In some embodiments, the tops of the WFM layers are lower than the top of the gate dielectric layer 82. In other embodiments, the top of the body metal layer 86 is higher than the top of either or both of the WFM layers. In the long channel FET, the insulating layer 89 is not substantially etched, as shown in FIG. 31C.

Further, as shown in FIGS. 32A-32C, a gate cap insulating layer 90 is formed in over the recessed conductive layers and the recessed gate dielectric layer 82. In some embodiments, the gate cap insulating layer 90 includes silicon nitride, SiON and/or SiOCN or any other suitable material. In a long channel FET as shown in FIG. 32C, the gate cap insulating layer 90 fills the space between the gate sidewall spacer 45 and the insulating layer 89. In some embodiments, the conductive layers 83-86 of the gate electrode and the gate dielectric layer 82 have a U-shape cross section.

FIGS. 33A-33D show various views of a detailed sequential process of FIGS. 11-13 for forming recesses for the gate cap insulating layers 90 according to an embodiment of the present disclosure. It is understood that additional operations can be provided before, during, and after processes shown by FIGS. 33A-33D, and some of the operations described below can be replaced or eliminated, for additional embodiments of the method. The order of the operations/processes may be interchangeable. Materials, processes, methods, dimensions and/or configurations as explained with the foregoing embodiments may be applied to the following embodiments, and detailed description thereof may be omitted.

In some embodiments, after a plurality of sacrificial gate structures 40 are formed, part of the sacrificial gate electrodes are cut or etched to form one or more spaces, and the spaces are filled by a dielectric material 200 as shown in FIG. 33A, which shows a plan view (top) and a cross sectional view (bottom). In some embodiments, part of the fin structures below the sacrificial gate structures is also etched. The dielectric material 200 includes one or more of silicon nitride, SiON or any other suitable dielectric material. As shown in FIG. 33A, an upper portion of the filled dielectric material 200 has a funnel shape in some embodiments.

FIG. 33B corresponds to FIGS. 17C, 21A and 21C, and FIG. 33C corresponds to FIGS. 18B-18D and 22A-22B. In some embodiments, due to the funnel shape of the dielectric material 200, the recessed amount of the ILD layer 62 adjacent to the dielectric material 200 is smaller than the recessed amount between the sacrificial gate structures 40.

FIG. 33D corresponds to FIGS. 31A-31C. After the metal gate structure 84 is recessed, the funnel shape of the dielectric material 200 and the third insulating layer 66 adjacent to the dielectric material 200 are removed in some embodiments.

Figure 34:
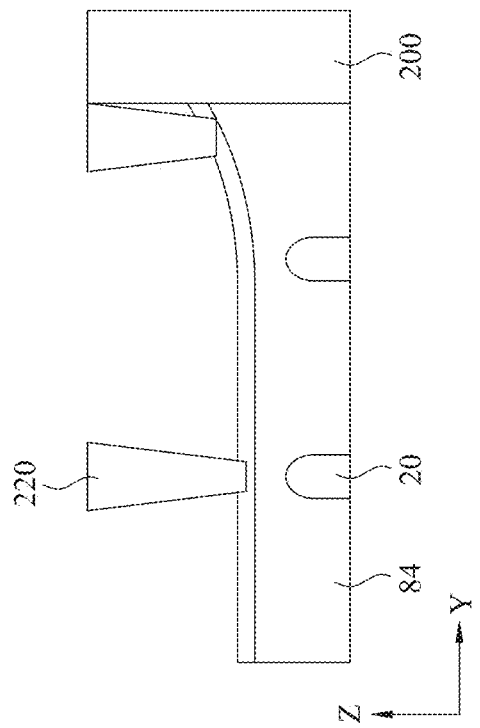
FIGS. 34 and 35 show the various stages of a sequential process for manufacturing a semiconductor device according to an embodiment of the present disclosure.
Figure 35:
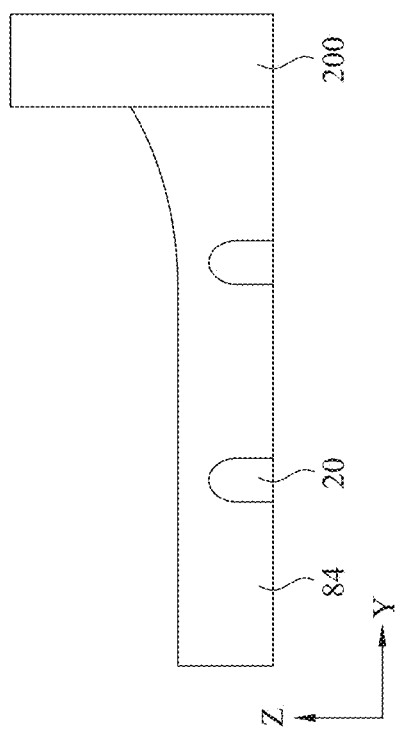

FIG. 34 is a cross sectional view after the metal gate electrode layer 84 is recessed, and FIG. 35 shows after contacts 220 to the gate electrode layer 84 is formed, both of which correspond to line Y11-Y11 of FIG. 33D. As shown in FIG. 34, the recessed metal gate electrode layer 84 has a slight "horn" shape at or near the interface to the dielectric material 200. In the present disclosure, however, since the ILD layer 62 is recessed by using two step etching processed to suppress the peak-to-valley distance, the horn height is reduced or suppressed so as not to cause any defects or performance degradation.

The various embodiments or examples described herein offer several advantages over the existing art. In the embodiments of the present disclosure, since the ILD layer between adjacent gate structures has a flatter upper surface by using two step etching operations, it is possible to improve various device performances and yield of the manufactured semiconductor devices.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, a sacrificial gate structure is formed over a substrate. The sacrificial gate structure includes a sacrificial gate electrode. A first dielectric layer is formed over the sacrificial gate structure. A second dielectric layer is formed over the first dielectric layer. The second and first dielectric layers are planarized. The second and first dielectric layers are recessed such that an upper portion of the sacrificial gate structure is exposed while a lower portion of the sacrificial gate structure being embedded in the first dielectric layer. A third dielectric layer is formed over the exposed sacrificial gate structure and over the first dielectric layer. A fourth dielectric layer is formed over the third dielectric layer. The fourth and third dielectric layers are planarized such that the sacrificial gate electrode is exposed and part of the third dielectric layer remains on the recessed first dielectric layer. In the recessing the first dielectric layer, a first etching operation and a second etching operation using a different etching as from the first etching operation are performed. In one or more of the foregoing and following embodiments, the first etching operation is a chemical dry etching process not using plasma and the second etching operation is a plasma dry etching process. In one or more of the foregoing and following embodiments, an etching gas of the chemical dry etching process includes HF and $NH_3$. In one or more of the foregoing and following embodiments, an etching gas of the plasma dry etching process includes $NF_3$ and $H_2$. In one or more of the foregoing and following embodiments, the first dielectric layer includes a silicon oxide based material, and the second dielectric layer includes a silicon nitride based material different from the first dielectric layer. In one or more of the foregoing and following embodiments, the third dielectric layer includes a silicon nitride based material, and the fourth dielectric layer includes a silicon oxide based material different from the third dielectric layer. In one or more of the foregoing and following embodiments, the planarizing the fourth and third dielectric layers includes: a first chemical mechanical polishing (CMP) process for etching the fourth dielectric layer; a second CMP process for etching the third dielectric layer, which ends when the sacrificial gate electrode is exposed; and a third CMP process for recessing the third dielectric layer and the sacrificial gate electrode. In one or more of the foregoing and following embodiments, the first CMP process comprises a first end point detection and a first over-polishing after detection of the first end point, the second CMP process comprises a second end point detection and a second over-polishing after detection of the second end point, and the third CMP process is time-controlled without using an end point detection. In one or more of the foregoing and following embodiments, the second over-polishing is performed for 5-15 seconds.

In accordance with another aspect of the present disclosure, in a method of manufacturing a semiconductor device, sacrificial gate structures and a first dielectric layer are formed over a substrate. Each of the sacrificial gate structures includes a sacrificial gate electrode, the sacrificial gate structures are embedded in the first dielectric layer and an upper surface of each of the sacrificial gate structures is exposed from the first dielectric layer. The first dielectric layer is partially removed. A second dielectric layer is formed over the partially removed first dielectric layer. The sacrificial gate electrode is removed from each of the sacrificial gate structures, thereby forming gate spaces. Gate electrode structures are formed in the gate spaces. After the first gate dielectric layer is partially removed, a peak-to-valley distance of the partially removed first dielectric layer between two adjacent sacrificial gate structures is in a range from 1 nm to 10 nm. In one or more of the foregoing and following embodiments, in the partially removing the first dielectric layer, a first etching operation and a second etching operation using a different etching as from the first etching operation are performed. In one or more of the foregoing and following embodiments, after the first etching operation, a peak-to-valley distance of the partially removed first dielectric layer between two adjacent sacrificial gate structures is in a range from 2 nm to 15 nm, which is greater than a peak-to-valley distance after the second etching operation. In one or more of the foregoing and following embodiments, an angle of an upper surface of the dielectric layer after the second etching operation at an interface to one of the two adjacent sacrificial gate structures is 60 degrees to 95 degrees with respect to the one of the two adjacent sacrificial gate structures. In one or more of the foregoing and following embodiments, an angle of an upper surface of the dielectric layer after the first etching operation and before the second etching operation at an interface to one of the two adjacent sacrificial gate structures is 10 degrees to 50 degrees with respect to the one of the two adjacent sacrificial gate structures. In one or more of the foregoing and following embodiments, each of the sacrificial gate structures includes a sacrificial gate dielectric layer, first gate sidewall spacers disposed on opposing side faces of the sacrificial gate electrode and second gate sidewall spacers disposed on the first gate sidewall spacers. In one or more of the foregoing and following embodiments, the first gate sidewall spacers have a higher nitrogen concentration than the second gate sidewall spacers. In one or more of the foregoing and following embodiments, an etch stop layer is further formed between the first dielectric layer and the second gate sidewall spacers.

In accordance with another aspect of the present disclosure, in a method of manufacturing a semiconductor device, sacrificial gate structures and a first dielectric layer are formed over a substrate. Each of the sacrificial gate structures includes a sacrificial gate electrode, a sacrificial gate dielectric layer, first gate sidewall spacers disposed on opposing side faces of the sacrificial gate electrode and second gate sidewall spacers disposed on the first gate sidewall spacers, the sacrificial gate structures are embedded in the first dielectric layer and an upper surface of each of the sacrificial gate structures is exposed from the first dielectric layer. The first dielectric layer is partially removed. A second dielectric layer is formed over the partially removed first dielectric layer. The sacrificial gate electrode is partially removed from each of the sacrificial gate structures. The second gate sidewall spacers are partially removed. A remaining sacrificial gate electrode is fully removed. The sacrificial gate dielectric layer is removed, thereby forming a gate space. A gate electrode structure is formed in the gate space. In one or more of the foregoing and following embodiments, in the partially removing the first dielectric layer, a first etching operation and a second etching operation using a different etching as from the first etching operation are performed. In one or more of the foregoing and following embodiments, the first etching operation is a chemical dry etching process using HF and $NH_3$ and the second etching operation is a plasma dry etching process using $NF_3$ and $H_2$.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming sacrificial gate structures and a first dielectric layer over a substrate, wherein each of the sacrificial gate structures includes a sacrificial gate electrode, the sacrificial gate structures are embedded in the first dielectric layer and an upper surface of each of the sacrificial gate structures is exposed from the first dielectric layer;
    partially removing the first dielectric layer;
    forming a second dielectric layer over the partially removed first dielectric layer;
    removing the sacrificial gate electrode from each of the sacrificial gate structures, thereby forming gate spaces; and
    forming gate electrode structures in the gate spaces,
    wherein after the first dielectric layer is partially removed, a peak-to-valley distance of the partially removed first dielectric layer between two adjacent sacrificial gate structures is in a range from 1 nm to 10 nm.

2. The method of claim 1, wherein the partially removing the first dielectric layer comprises a first etching operation and a second etching operation using a different etchant than the first etching operation.

3. The method of claim 2, wherein after the first etching operation, a peak-to-valley distance of the partially removed first dielectric layer between two adjacent sacrificial gate structures is in a range from 2 nm to 15 nm, which is greater than a peak-to-valley distance after the second etching operation.

4. The method of claim 3, wherein an angle of an upper surface of the first dielectric layer after the second etching operation at an interface to one of the two adjacent sacrificial gate structures is 60 degrees to 95 degrees with respect to the one of the two adjacent sacrificial gate structures.

5. The method of claim 3, wherein an angle of an upper surface of the first dielectric layer after the first etching operation and before the second etching operation at an interface to one of the two adjacent sacrificial gate structures is 10 degrees to 50 degrees with respect to the one of the two adjacent sacrificial gate structures.

6. The method of claim 1, wherein each of the sacrificial gate structures includes a sacrificial gate dielectric layer, first gate sidewall spacers disposed on opposing side faces of the sacrificial gate electrode and second gate sidewall spacers disposed on the first gate sidewall spacers.

7. The method of claim 6, wherein the first gate sidewall spacers have a higher nitrogen concentration than the second gate sidewall spacers.

8. The method of claim 6, wherein an etch stop layer is further formed between the first dielectric layer and the second gate sidewall spacers.

9. A method of manufacturing a semiconductor device, comprising:
forming sacrificial gate structures and a first dielectric layer over a substrate, wherein each of the sacrificial gate structures includes a sacrificial gate electrode, a sacrificial gate dielectric layer, first gate sidewall spacers disposed on opposing side faces of the sacrificial gate electrode and second gate sidewall spacers disposed on the first gate sidewall spacers, the sacrificial gate structures are embedded in the first dielectric layer and an upper surface of each of the sacrificial gate structures is exposed from the first dielectric layer;
partially removing the first dielectric layer;
forming a second dielectric layer over the partially removed first dielectric layer;
partially removing the sacrificial gate electrode from each of the sacrificial gate structures;
partially removing the second gate sidewall spacers;
fully removing a remaining sacrificial gate electrode;
removing the sacrificial gate dielectric layer, thereby forming a gate space; and
forming a gate electrode structure in the gate space.

10. The method of claim 9, wherein the partially removing the first dielectric layer comprises a first etching operation and a second etching operation using a different etchant than the first etching operation.

11. The method of claim 10, wherein the first etching operation is a chemical dry etching process using HF and $NH_3$ and the second etching operation is a plasma dry etching process using $NF_3$ and $H_2$.

12. The method of claim 10, wherein an angle of an upper surface of the first dielectric layer after the second etching operation at an interface to one of two adjacent sacrificial gate structures is 60 degrees to 95 degrees with respect to the one of two adjacent sacrificial gate structures.

13. The method of claim 10, wherein an angle of an upper surface of the first dielectric layer after the first etching operation and before the second etching operation at an interface to one of two adjacent sacrificial gate structures is 10 degrees to 50 degrees with respect to the one of the two adjacent sacrificial gate structures.

14. The method of claim 9, wherein the first gate sidewall spacers have a higher nitrogen concentration than the second gate sidewall spacers.

15. A method of manufacturing a semiconductor device, comprising:
forming a first dielectric layer over sacrificial gate structures formed over a substrate, wherein each of the sacrificial gate structures includes a sacrificial gate electrode;
forming a second dielectric layer over the first dielectric layer;
removing the second dielectric layer;
planarizing the first dielectric layer to expose an upper surface of the sacrificial gate electrode;
recessing the first dielectric layer to expose an upper portion of each of the sacrificial gate structures while a lower portion of each of the sacrificial gate structures is embedded in the first dielectric layer;
forming a third dielectric layer over the exposed upper portion of each of the sacrificial gate structures and the recessed first dielectric layer;
forming a fourth dielectric layer over the third dielectric layer;
removing the fourth dielectric layer; and
planarizing the third dielectric layer to expose the upper surface of the sacrificial gate electrode while part of the third dielectric layer remains on the recessed first dielectric layer,
wherein the recessing the first dielectric layer comprises a first etching operation and a second etching operation using a different etchant than the first etching operation, and
wherein after the first dielectric layer is recessed, a first peak-to-valley distance of the recessed first dielectric layer between two adjacent sacrificial gate structures is in a range from 1 nm to 10 nm.

16. The method of claim 15, wherein each of the sacrificial gate structures further includes a sacrificial gate dielectric.

17. The method of claim 15, wherein the first peak-to-valley distance of the recessed first dielectric layer between the two adjacent sacrificial gate structures after the first etching operation is greater than a second peak-to-valley distance of the recessed first dielectric layer between the two adjacent sacrificial gate structures after the second etching operation.

18. The method of claim 15, wherein an angle of an upper surface of the first dielectric layer after the second etching operation at an interface to one of the two adjacent sacrificial gate structures is 60 degrees to 95 degrees with respect to the one of the two adjacent sacrificial gate structures.

19. The method of claim 15, wherein an angle of an upper surface of the first dielectric layer after the first etching operation and before the second etching operation at an interface to one of the two adjacent sacrificial gate structures is 10 degrees to 50 degrees with respect to the one of the two adjacent sacrificial gate structures.

20. The method of claim 15, wherein the first etching operation is a chemical dry etching process using HF and $NH_3$ and the second etching operation is a plasma dry etching process using $NF_3$ and $H_2$.

* * * * *